(12) United States Patent
Murakami

(10) Patent No.: US 12,369,407 B2
(45) Date of Patent: Jul. 22, 2025

(54) SEMICONDUCTOR DEVICE AND MANUFACTURING METHOD OF SEMICONDUCTOR DEVICE

(71) Applicant: Kioxia Corporation, Tokyo (JP)

(72) Inventor: Hideaki Murakami, Saitama Saitama (JP)

(73) Assignee: Kioxia Corporation, Tokyo (JP)

( * ) Notice: Subject to any disclaimer, the term of this patent is extended or adjusted under 35 U.S.C. 154(b) by 332 days.

(21) Appl. No.: 17/902,746

(22) Filed: Sep. 2, 2022

(65) Prior Publication Data

US 2023/0290772 A1    Sep. 14, 2023

(30) Foreign Application Priority Data

Mar. 14, 2022    (JP) .................................. 2022-039400

(51) Int. Cl.
| | |
|---|---|
| H10D 89/60 | (2025.01) |
| H10B 12/00 | (2023.01) |
| H10B 20/00 | (2023.01) |
| H10B 43/40 | (2023.01) |
| H10B 51/40 | (2023.01) |
| H10B 53/40 | (2023.01) |
| H10B 99/00 | (2023.01) |

(52) U.S. Cl.
CPC ........... *H10D 89/811* (2025.01); *H10B 12/50* (2023.02); *H10B 20/65* (2023.02); *H10B 43/40* (2023.02); *H10B 51/40* (2023.02); *H10B 53/40* (2023.02); *H10B 99/16* (2023.02); *H10D 89/611* (2025.01); *H10D 89/921* (2025.01); *H10D 89/931* (2025.01)

(58) Field of Classification Search
CPC .. H10D 89/611; H10D 89/921; H10D 89/931; H10B 12/50; H10B 20/65; H10B 40/41; H10B 43/40; H10B 51/40; H10B 53/40; H10B 99/16
See application file for complete search history.

(56) References Cited

U.S. PATENT DOCUMENTS

| | | |
|---|---|---|
| 5,646,808 A | 7/1997 | Nakayama |
| 6,031,257 A | 2/2000 | Noto et al. |
| 6,075,686 A | 6/2000 | Ker |
| 6,078,514 A | 6/2000 | Takemae et al. |
| 6,198,136 B1 | 3/2001 | Voldman et al. |
| 6,433,407 B2 | 8/2002 | Gotoh et al. |
| 7,960,823 B2 | 6/2011 | Uchino |
| 7,989,954 B2 | 8/2011 | Lin et al. |

(Continued)

FOREIGN PATENT DOCUMENTS

JP    2015179740 A    10/2015

*Primary Examiner* — David A Zarneke
(74) *Attorney, Agent, or Firm* — Holtz, Holtz & Volek PC

(57) ABSTRACT

A semiconductor device includes a semiconductor substrate, an internal circuit provided on the semiconductor substrate, a first and a second pads connected to the internal circuit, a first ESD protection circuit connectable to the first pad, and a second ESD protection circuit connectable to the second pad. The first ESD protection circuit includes a first ESD protection element, and the second ESD protection circuit includes a second and a third ESD protection elements. The second pad is connected to the internal circuit via the second ESD protection element, and the first pad is directly connected to the internal circuit.

8 Claims, 14 Drawing Sheets

(56) References Cited

U.S. PATENT DOCUMENTS

| | | |
|---|---|---|
| 8,611,154 B2 | 12/2013 | Asano et al. |
| 9,708,085 B2 * | 7/2017 | Moore .................... B65B 13/02 |
| 11,056,880 B1 | 7/2021 | Mathur et al. |
| 2011/0051301 A1 | 3/2011 | Thijs et al. |
| 2016/0086935 A1 | 3/2016 | Fukuda |
| 2016/0211253 A1 | 7/2016 | Tsai |

* cited by examiner

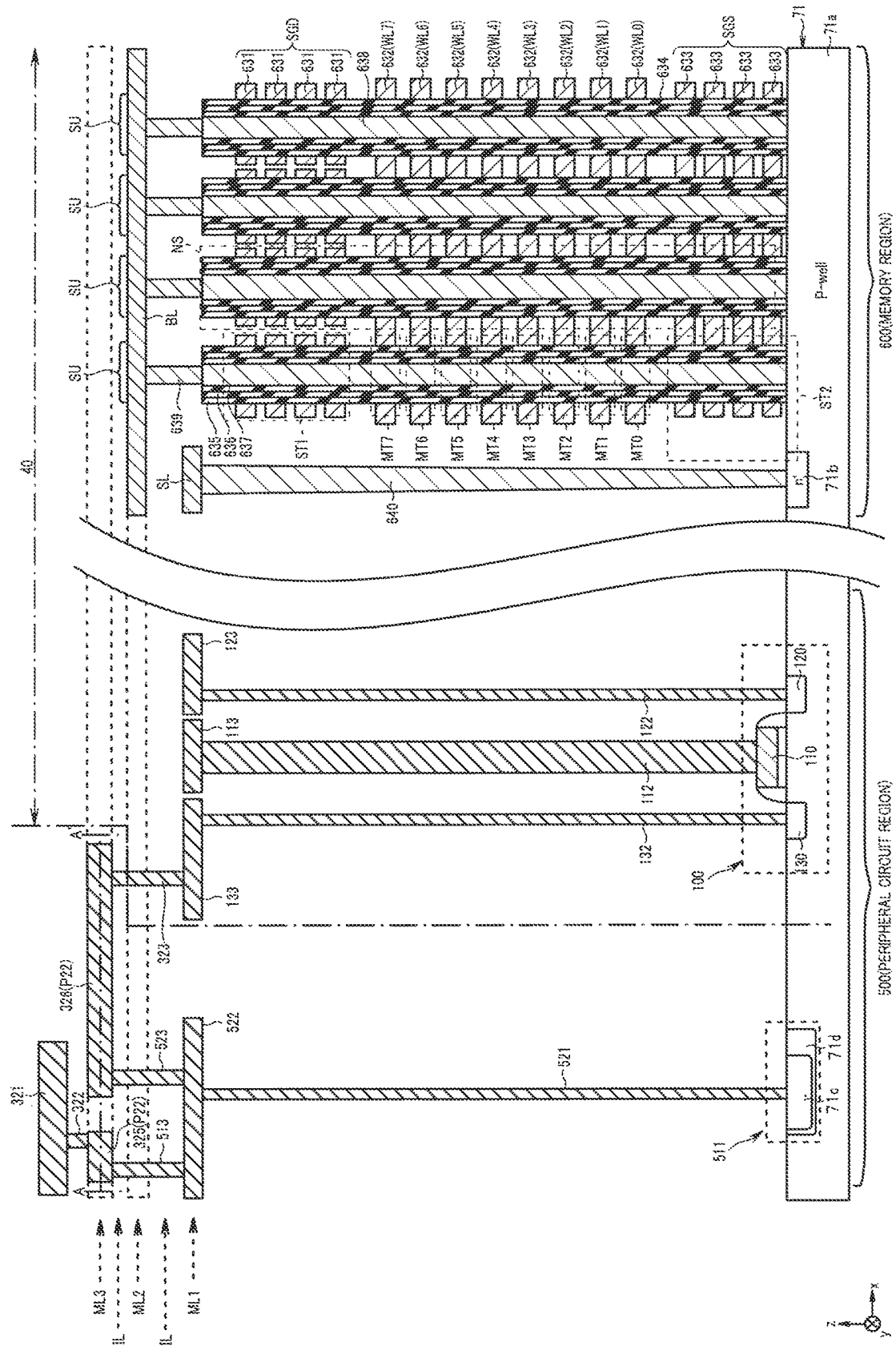

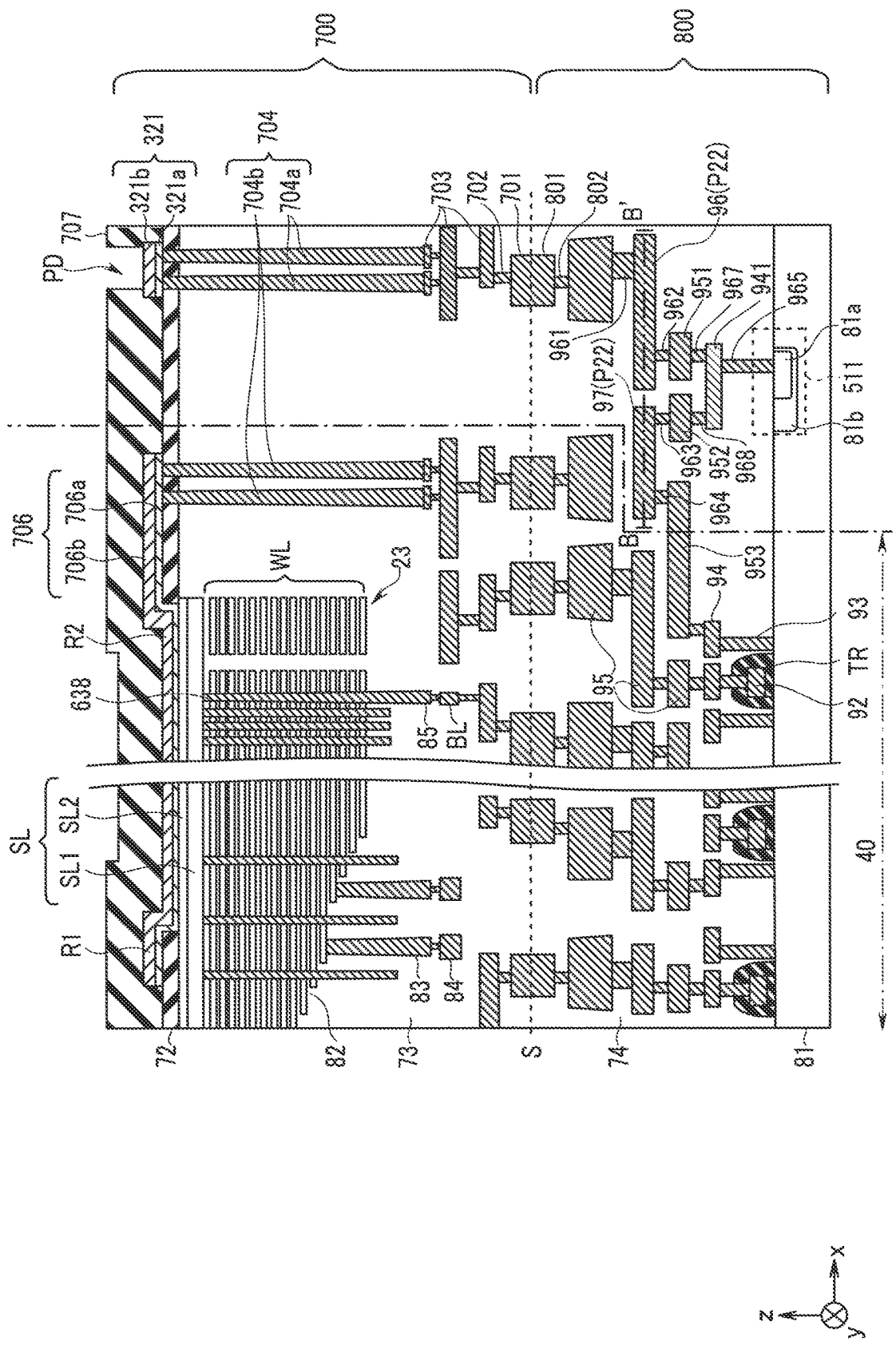

SEMICONDUCTOR DEVICE AND MANUFACTURING METHOD OF SEMICONDUCTOR DEVICE

CROSS-REFERENCE TO RELATED APPLICATIONS

This application is based upon and claims the benefit of priority from the prior Japanese Patent Application No. 2022-039400 filed on Mar. 14, 2022; the entire contents of which are incorporated herein by reference.

FIELD

An embodiment described herein relates generally to a semiconductor device and a manufacturing method of the semiconductor device.

BACKGROUND

In recent years, ESD (electro static discharge) of a circuit mounted inside a semiconductor device has become problematic. Thus, a semiconductor device including an ESD protection element has been proposed. On the other hand, it has been demanded to increase input/output transfer speed (I/O operation speed) of a semiconductor device.

BRIEF DESCRIPTION OF THE DRAWINGS

FIG. 6A is a cross-sectional view of a partial region of a semiconductor device including the memory cell array of the NAND memory having the three-dimensional structure;

FIG. 9A is a schematic cross-sectional view for explaining a structure of a semiconductor device formed by bonding an array chip and a circuit chip;

DETAILED DESCRIPTION

A semiconductor device of the present embodiment includes a semiconductor substrate, an internal circuit provided on the semiconductor substrate, a first pad and a second pad connected to the internal circuit, a first ESD protection circuit connectable to the first pad, and a second ESD protection circuit connectable to the second pad. The first ESD protection circuit and the second ESD protection circuit respectively include ESD protection elements. The first pad is connected to the internal circuit via the first ESD protection circuit, and the second pad is directly connected to the internal circuit.

An embodiment will be described below with reference to the drawings.

1. Configuration (1-1. Configuration of Memory System)

Figure 1:
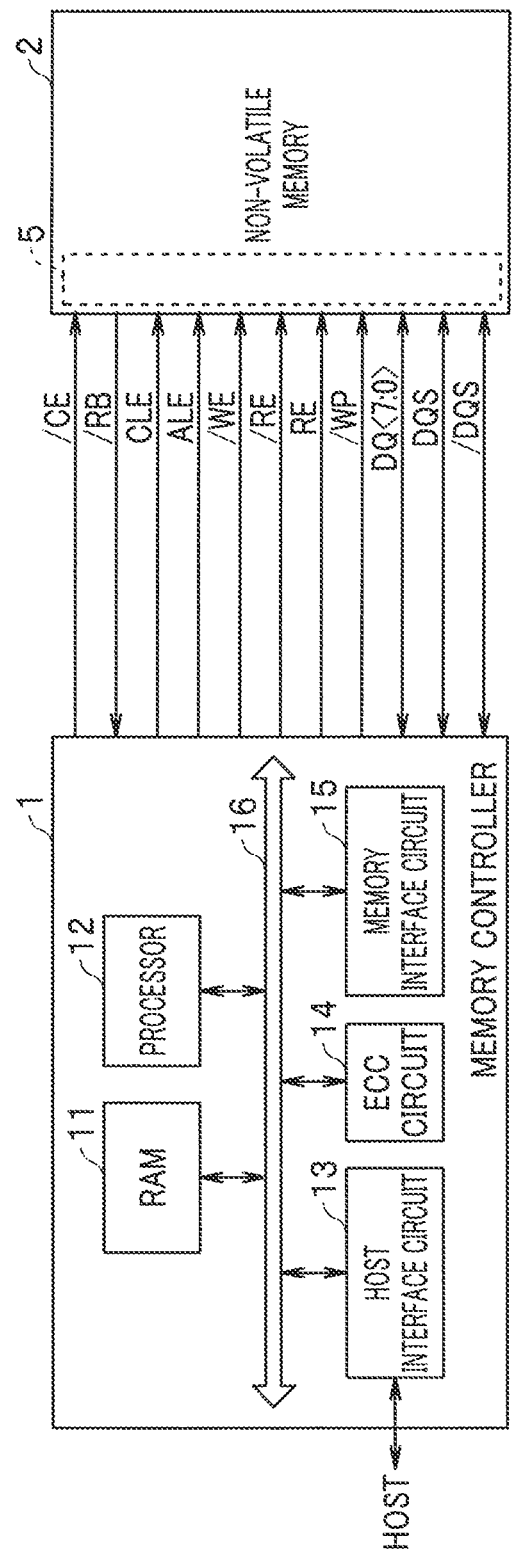
FIG. 1 is a block diagram illustrating a configuration example of a memory system according to an embodiment.

FIG. 1 is a block diagram illustrating a configuration example of a memory system using a semiconductor device according to the embodiment. The memory system of the embodiment includes a memory controller 1 and a non-volatile memory 2 as a semiconductor device. The memory system is connectable to a host. The host is, for example, electronic equipment such as a personal computer and a mobile terminal.

The non-volatile memory 2, which is a memory that stores data in a non-volatile manner, includes, for example, a NAND memory (NAND flash memory). The non-volatile memory 2 is, for example, a NAND memory including a memory cell that can store three bits per memory cell, that is, a 3-bit-per-cell (TLC: triple level cell) NAND memory. Note that the non-volatile memory 2 may be a 1-bit-per-cell, 2-bit-per-cell, four-bit-per-cell or multi-level-cell NAND memory that can store a plurality of bits. Further, the non-volatile memory 2 generally includes a plurality of memory chips. Still further, the non-volatile memory 2 includes an ESD protection unit 5 including an ESD protection element.

The memory controller 1 controls write of data in the non-volatile memory 2 in accordance with a write request from the host. Further, the memory controller 1 controls read of data from the non-volatile memory 2 in accordance with a read request from the host. Respective signals of a chip enable signal /CE, a ready/busy signal /RB, a command latch enable signal CLE, an address latch enable signal ALE, a write enable signal /WE, read enable signals RE and /RE, a write protect signal /WP, a signal DQ<7:0> that is data and data strobe signals DQS and /DQS are transmitted and received between the memory controller 1 and the non-volatile memory 2. Note that "/" added to the signal name indicates active low.

For example, each of the non-volatile memory 2 and the memory controller 1 is formed as a semiconductor chip (hereinafter, also simply referred to as a "chip").

The chip enable signal /CE is a signal for selecting and enabling a specific memory chip of the non-volatile memory 2. The ready/busy signal /RB is a signal for indicating whether the non-volatile memory 2 is in a ready state (a state where a command can be accepted from outside) or a busy state (a state where a command cannot be accepted from outside). The memory controller 1 can understand the state of the non-volatile memory 2 by receiving the ready/busy signal /RB. The command latch enable signal CLE is a signal indicating that the signal DQ<7:0> is a command. The command latch enable signal CLE enables a command transmitted as a signal DQ to be latched to a command register in the selected memory chip of the non-volatile memory 2. The address latch enable signal ALE is a signal indicating that the signal DQ<7:0> is an address. The address latch enable signal ALE enables an address transmitted as a signal DQ to be latched to an address register in the selected memory chip of the non-volatile memory 2. The write enable signal /WE, which is a signal for taking in the received signal in the non-volatile memory 2, is asserted every time a command, an address and data are received by the memory controller 1. The non-volatile memory 2 is instructed to take in the signal DQ<7:0> while the signal /WE is in a "L (low)" level.

The read enable signals RE and /RE are signals to be used by the memory controller 1 to read data from the non-volatile memory 2. The read enable signals RE and /RE are, for example, used to control an operation timing of the non-volatile memory 2 when the signal DQ<7:0> is outputted. The write protect signal /WP is a signal for instructing the non-volatile memory 2 to prohibit write and erasure of data. The signal DQ<7:0> is data to be transmitted and received between the non-volatile memory 2 and the memory controller 1 and includes a command, an address and data. The data strobe signals DQS and /DQS are signals for controlling timings of input and output of the signal DQ<7:0>.

The memory controller 1 includes a RAM (random access memory) 11, a processor 12, a host interface circuit 13, an ECC (error check and correct) circuit 14 and a memory interface circuit 15. The RAM 11, the processor 12, the host interface circuit 13, the ECC circuit 14 and the memory interface circuit 15 are connected to one another with an internal bus 16.

The host interface circuit 13 outputs a request received from the host, user data (write data), and the like, to the internal bus 16. Further, the host interface circuit 13 transmits user data read from the non-volatile memory 2, a response from the processor 12, and the like, to the host.

The memory interface circuit 15 controls processing of writing the user data, and the like, in the non-volatile memory 2 and processing of reading the user data, and the like, from the non-volatile memory 2 on the basis of an instruction of the processor 12.

The processor 12 comprehensively controls the memory controller 1. The processor 12 is, for example, a CPU (central processing unit), an MPU (micro processing unit), or the like. In a case where the processor 12 receives a request from the host by way of the host interface circuit 13, the processor 12 performs control in accordance with the request. For example, the processor 12 instructs the memory interface circuit 15 to write user data and a parity in the non-volatile memory 2 in accordance with the request from the host. Further, the processor 12 instructs the memory interface circuit 15 to read user data and a parity from the non-volatile memory 2 in accordance with the request from the host.

The processor 12 determines a storage region (memory region) on the non-volatile memory 2 for the user data to be accumulated in the RAM 11. The user data is stored in the RAM 11 by way of the internal bus 16. The processor 12 determines the memory region for data (page data) in page unit that is a write unit. In the present specification, the user data to be stored in one page of the non-volatile memory 2 will be defined as unit data. The unit data is typically encoded by the ECC circuit 14 and stored in the non-volatile memory 2 as a code word. In the present embodiment, encoding is not essential. While the memory controller 1 may store the unit data in the non-volatile memory 2 without encoding the unit data, FIG. 1 illustrates a configuration where encoding is performed as one configuration example. In a case where the memory controller 1 does not perform encoding, the page data matches the unit data. Further, one code word may be generated on the basis of one piece of unit data or one code word may be generated on the basis of divided data obtained by dividing the unit data. Further, one code word may be generated using a plurality of pieces of unit data.

The processor 12 determines a memory region of the non-volatile memory 2 which is a write destination for each piece of unit data. A physical address is allocated to the memory region of the non-volatile memory 2. The processor 12 manages the memory region that is a write destination of the unit data using the physical address. The processor 12 instructs the memory interface circuit 15 to write the user data in the non-volatile memory 2 while designating the determined memory region (physical address). The processor 12 manages correspondence between a logical address (logical address managed by the host) and the physical address of the user data. In a case where the processor 12 receives a read request including the logical address from the host, the processor 12 specifies the physical address corresponding to the logical address and instructs the memory interface circuit 15 to read the user data while designating the physical address.

The ECC circuit 14 generates a code word from the user data stored in the RAM 11. Further, the ECC circuit 14 decodes the code word read from the non-volatile memory 2.

The RAM 11 temporarily stores the user data received from the host until the user data is stored in the non-volatile memory 2 or temporarily stores data read from the non-volatile memory 2 until the data is transmitted to the host. The RAM 11 is, for example, a general-purpose memory such as an SRAM (static random access memory) and a DRAM (dynamic random access memory).

FIG. 1 illustrates a configuration example where the memory controller 1 includes the ECC circuit 14 and the memory interface circuit 15. However, the ECC circuit 14 may be incorporated into the memory interface circuit 15. Alternatively, the ECC circuit 14 may be incorporated into the non-volatile memory 2.

In a case where a write request is received from the host, the memory system operates as follows. The processor 12 causes the RAM 11 to temporarily store data that is to be written. The processor 12 reads the data stored in the RAM 11 and inputs the data to the ECC circuit 14. The ECC circuit 14 encodes the inputted data and inputs the code word to the memory interface circuit 15. The memory interface circuit 15 writes the inputted code word in the non-volatile memory 2.

In a case where a read request is received from the host, the memory system operates as follows. The memory interface circuit 15 inputs the code word read from the non-volatile memory 2 to the ECC circuit 14. The ECC circuit 14 decodes the inputted code word and stores the decoded data in the RAM 11. The processor 12 transmits the data stored in the RAM 11 to the host via the host interface circuit 13.

(1-2. Configuration of Non-Volatile Memory)

Figure 2:
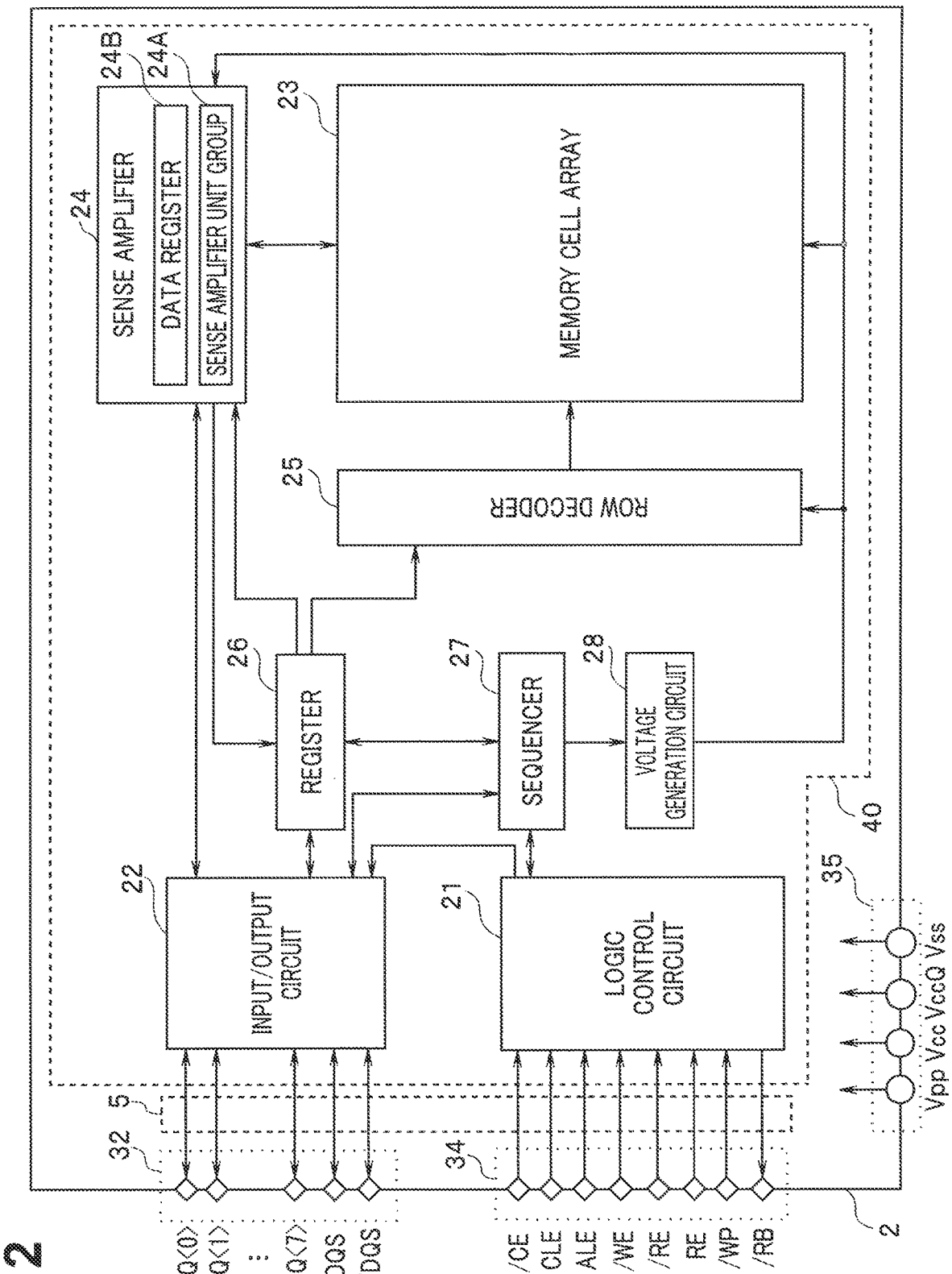
FIG. 2 is a block diagram illustrating a configuration example of a semiconductor device (non-volatile memory) according to the embodiment.

FIG. 2 is a block diagram illustrating a configuration example of a semiconductor device (non-volatile memory) according to the present embodiment. The non-volatile memory 2 includes a logic control circuit 21, an input/output circuit 22, a memory cell array 23, a sense amplifier 24, a row decoder 25, a register 26, a sequencer 27, a voltage generation circuit 28, an input/output pad group 32, a logic control pad group 34, and a power input pad group 35. Note that various circuits provided within the non-volatile memory 2, including the logic control circuit 21, the input/output circuit 22, the memory cell array 23, the sense amplifier 24, the row decoder 25, the register 26, the sequencer 27 and the voltage generation circuit 28 will be collectively indicated as an internal circuit 40. Further, the non-volatile memory 2 also includes the ESD protection unit 5. The ESD protection unit 5 is disposed between pad groups (specifically, the input/output pad group 32 and the logic control pad group 34) to which signals are inputted from outside and the internal circuit 40.

The memory cell array 23 includes a plurality of blocks. Each of the plurality of blocks includes a plurality of memory cell transistors (memory cells). A plurality of bit lines, a plurality of word lines, source lines, and the like, are disposed in the memory cell array 23 to control voltages to be applied to the memory cell transistors. A specific configuration of the block will be described later.

The input/output pad group 32 includes a plurality of terminals (pads) corresponding to the signal DQ<7:0> and the data strobe signals DQS and /DQS to transmit/receive the respective signals including data to/from the memory controller 1.

The logic control pad group 34 includes a plurality of terminals (pads) corresponding to the chip enable signal /CE, the command latch enable signal CLE, the address latch enable signal ALE, the write enable signal /WE, the read enable signals RE and /RE, the write protect signal /WP and the ready/busy signal /RB to transmit/receive the respective signals to/from the memory controller 1.

The power input pad group 35 includes a plurality of terminals (pads) to which power supply voltages Vcc, VccQ and Vpp and a ground voltage Vss are to be inputted for supplying various operating power supplies to the non-volatile memory 2 from outside. The power supply voltage Vcc is a circuit power supply voltage to be typically provided from outside as an operating power supply, and, for example, a voltage of approximately 3.3 V is inputted. As the power supply voltage VccQ, for example, a voltage of 1.2 V is inputted. The power supply voltage VccQ is used when a signal is transmitted/received between the memory controller 1 and the non-volatile memory 2.

The power supply voltage Vpp is a power supply voltage higher than the power supply voltage Vcc, and, for example, a voltage of 12 V is inputted. A high voltage of approximately 20 V is required to write data in the memory cell array 23 or erase data. In this event, a desired voltage can be generated at higher speed with lower power consumption by boosting the power supply voltage Vpp of approximately 12 V than by boosting the power supply voltage Vcc of approximately 3.3 V at a booster circuit of the voltage generation circuit 28. The power supply voltage Vcc is a power supply to be normally supplied to the non-volatile memory 2, and the power supply voltage Vpp is a power supply to be additionally/arbitrarily supplied in accordance with, for example, a use environment.

The logic control circuit 21 and the input/output circuit 22 are connected to the memory controller 1 via the NAND bus. The input/output circuit 22 transmits/receives the signal DQ (for example, DQ<0> to DQ<7>) to/from the memory controller 1 via the NAND bus.

The logic control circuit 21 receives external control signals (for example, the chip enable signal /CE, the command latch enable signal CLE, the address latch enable signal ALE, the write enable signal /WE, the read enable signals RE and /RE and the write protect signal /WP) from the memory controller 1 via the NAND bus. Further, the logic control circuit 21 transmits the ready/busy signal /RB to the memory controller 1 via the NAND bus.

The input/output circuit 22 transmits/receives the signal DQ<7:0> and the data strobe signals DQS and /DQS to/from the memory controller 1. The input/output circuit 22 transfers a command and an address in the signal DQ<7:0> to the register 26. Further, the input/output circuit 22 transmits/receives write data and read data to/from the sense amplifier 24.

The register 26 includes a command register, an address register, a status register, and the like. The command register temporarily stores a command. The address register temporarily stores an address. The status register temporarily stores data necessary for operation of the non-volatile memory 2. The register 26 includes, for example, an SRAM.

The sequencer 27 as a control unit receives a command from the register 26 and controls the non-volatile memory 2 in accordance with a sequence based on the command.

The voltage generation circuit 28 receives a power supply voltage from outside of the non-volatile memory 2 and generates a plurality of voltages necessary for write operation, read operation and erasure operation using the power supply voltage. The voltage generation circuit 28 supplies the generated voltages to the memory cell array 23, the sense amplifier 24, the row decoder 25, and the like.

The row decoder 25 receives a row address from the register 26 and decodes the row address. The row decoder 25 performs selection operation of a word line on the basis of the decoded row address. Then, the row decoder 25 transfers a plurality of voltages necessary for write operation, read operation and erasure operation, to the selected block.

The sense amplifier 24 receives a column address from the register 26 and decodes the column address. The sense amplifier 24 includes a sense amplifier unit group 24A and a data register 24B. The sense amplifier unit group 24A is connected to each of bit lines and selects one of the bit lines on the basis of the decoded column address. Further, the sense amplifier unit group 24A detects and amplifies data read to the bit line from the memory cell transistor upon data read. Further, the sense amplifier unit group 24A transfers write data to the bit line upon data write.

The data register 24B temporarily stores data detected by the sense amplifier unit group 24A upon data read and serially transfers the data to the input/output circuit 22. Further, the data register 24B temporarily stores data serially transferred from the input/output circuit 22 upon data write and transfers the data to the sense amplifier unit group 24A. The data register 24B includes an SRAM, and the like.

Figure 3:
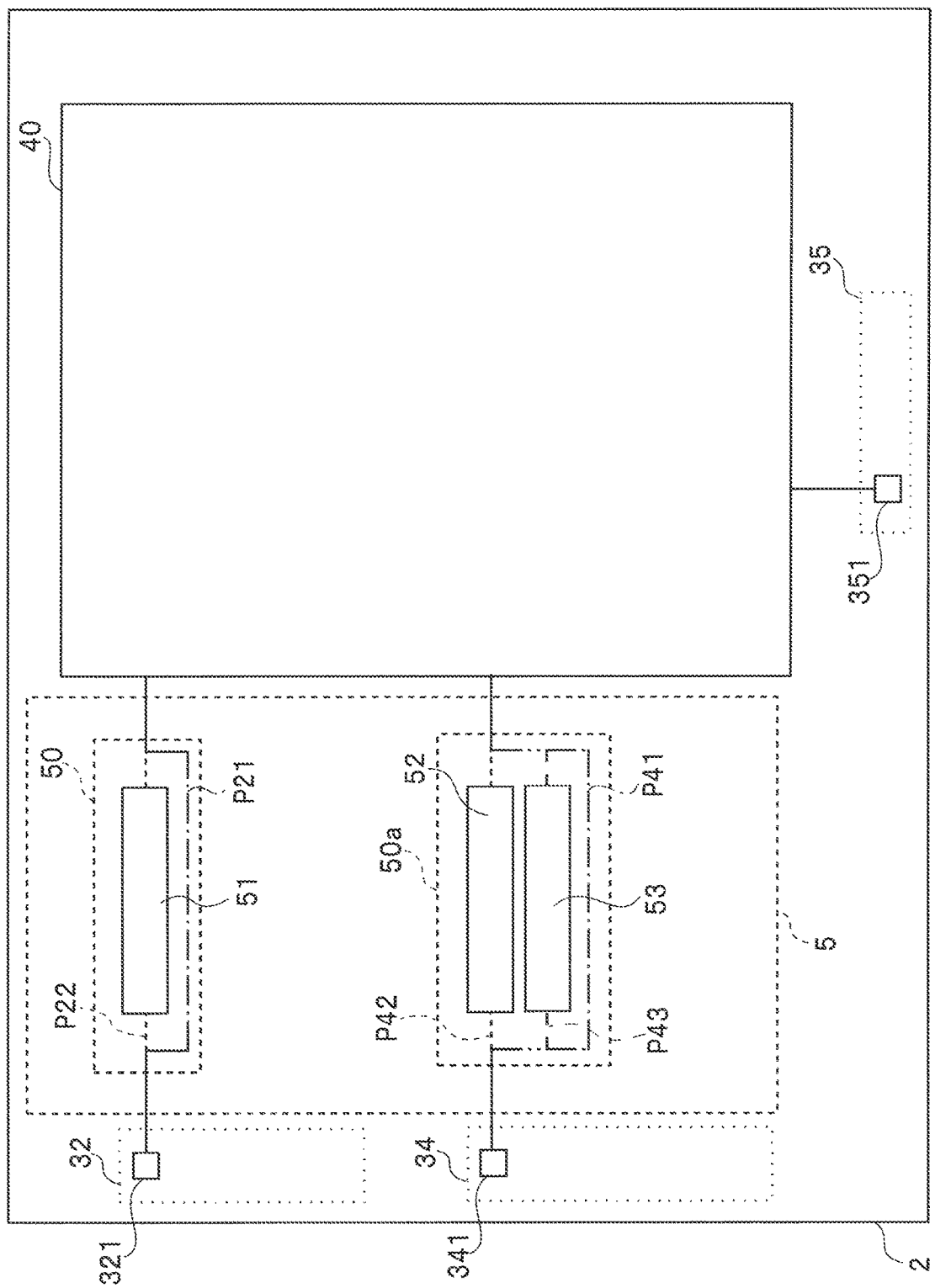
FIG. 3 is a block diagram illustrating a configuration example of a wiring that connects pads and an internal circuit.

FIG. 3 is a block diagram illustrating a configuration example of a wiring that connects the pads and the internal circuit. The input/output pad group 32 includes a plurality of pads corresponding to the signal DQ<7:0> and the data strobe signals DQS and /DQS, and FIG. 3 illustrates one pad 321 (for example, a pad corresponding to the signal DQ<0>)

among the plurality of pads. Further, the logic control pad group 34 includes a plurality of pads corresponding to the chip enable signal /CE, the command latch enable signal CLE, the address latch enable signal ALE, the write enable signal /WE, the read enable signals RE and /RE, the write protect signal /WP and the ready/busy signal /RB, and FIG. 3 illustrates one pad 341 (for example, a pad corresponding to the chip enable signal /CE) among the plurality of pads. Further, the power input pad group 35 includes a plurality of pads to which the power supply voltages Vcc, VccQ and Vpp and the ground voltage Vss are to be inputted to supply various operating power supplies to the non-volatile memory 2 from outside, and FIG. 3 illustrates one pad 351 (for example, a pad to which the power supply voltage Vcc is to be inputted) among the plurality of pads.

The pads formed in the input/output pad group 32, the logic control pad group 34 and the power input pad group 35 are electrically connected to the internal circuit 40. The ESD protection unit 5 is formed between the pad groups (specifically, the input/output pad group 32 and the logic control pad group 34) to which signals are inputted from outside and the internal circuit 40. The ESD protection unit 5 includes a plurality of ESD protection circuits. The ESD protection circuits are provided to respectively correspond to the plurality of pads included in the input/output pad group 32 and the logic control pad group 34. For example, as illustrated in FIG. 3, an ESD protection circuit 50 corresponding to the pad 321 and an ESD protection circuit 50a corresponding to the pad 341 are formed in the ESD protection unit 5. Note that ESD protection circuits (not illustrated) corresponding to other pads (not illustrated) are also formed in the ESD protection unit 5.

The ESD protection circuit includes one or more ESD protection elements, a path that bypasses the ESD protection element (hereinafter, referred to as a detour path), and a path through the ESD protection element (hereinafter, referred to as a through path). The detour path is a path that directly connects the pad and the internal circuit 40 without interposition of the ESD protection element. The through path is a path that connects the pad and the internal circuit 40 via the ESD protection element. For example, the ESD protection circuit 50 includes an ESD protection element 51, a path P21 as the detour path and a path P22 as the through path. Further, for example, the ESD protection circuit 50a includes two ESD protection elements 52 and 53, a path P41 as the detour path and paths P42 and P43 as the through paths. The path P42 is a path that connects the pad 341 and the internal circuit 40 via the ESD protection element 52. The path P43 is a path that connects the pad 341 and the internal circuit 40 via the ESD protection element 53.

Figure 4:
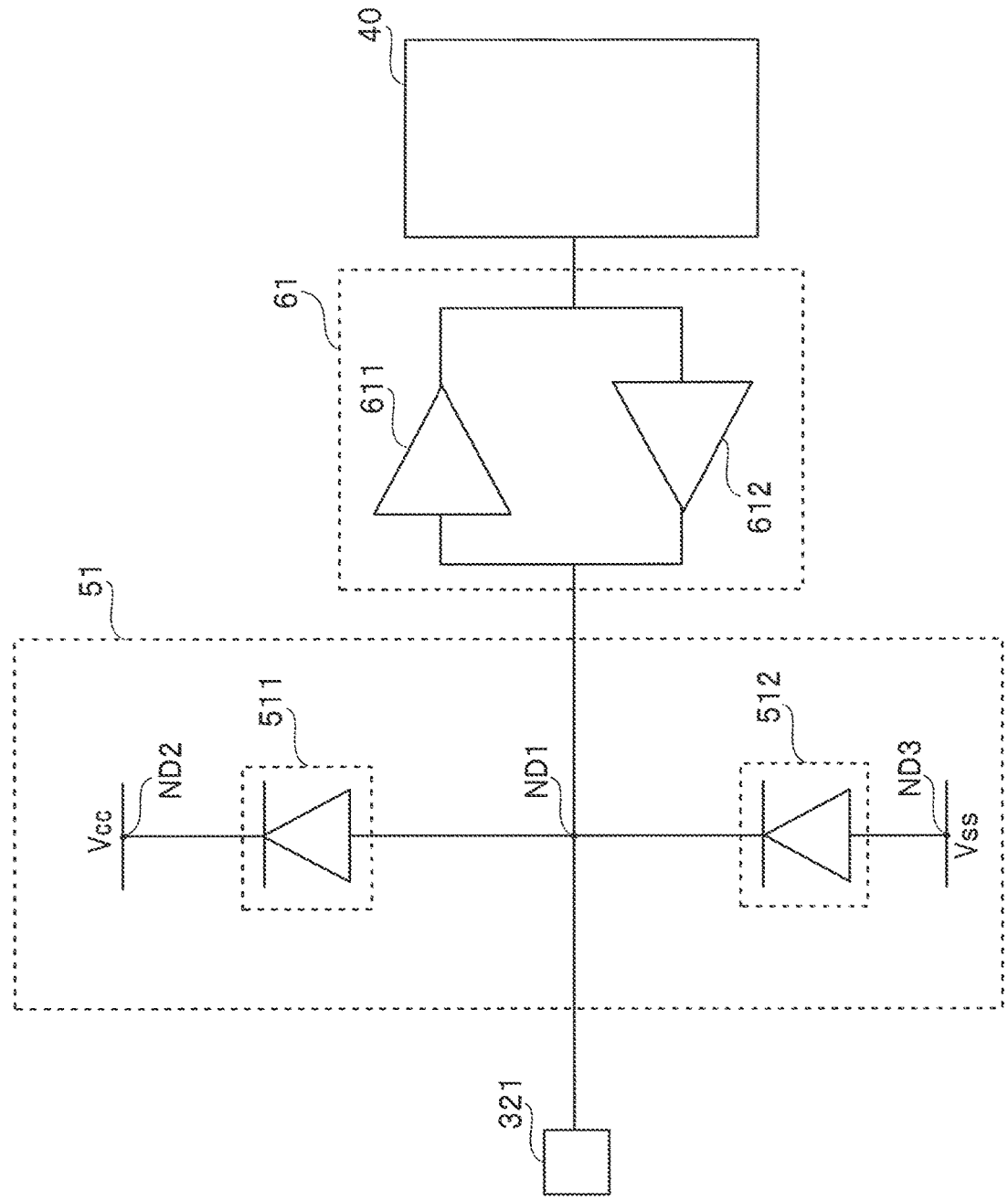
FIG. 4 is a circuit diagram for explaining a configuration example of an ESD protection circuit.

The ESD protection element 51 is an element that prevents a voltage exceeding an electrostatic withstand voltage from being applied to the internal circuit 40 when an ESD occurs in the pad 321. The ESD protection elements 52 and 53 are elements that prevent a voltage exceeding an electrostatic withstand voltage from being applied to the internal circuit 40 when an ESD occurs in the pad 341. FIG. 4 is a circuit diagram for explaining a configuration example of the ESD protection element. The ESD protection element 51 includes a first diode 511 and a second diode 512. An anode of the first diode 511 and a cathode of the second diode 512 are connected to a node ND1. A cathode of the first diode 511 is connected to a node ND2. The power supply voltage Vcc is supplied to the node ND2. An anode of the second diode 512 is connected to a node ND3. The ground voltage Vss is supplied to the node ND3.

FIG. 4 illustrates a case where the pad 321 and the internal circuit 40 are connected through the path P22 via the ESD protection element 51 as an example. The pad 321 is connected to the internal circuit 40 via the node ND1 and a driver/receiver circuit 61. The driver/receiver circuit 61 includes an input buffer 611 and an output buffer 612. An input terminal of the input buffer 611 is connected to the node ND1, and an output terminal of the input buffer 611 is connected to the internal circuit 40. An input terminal of the output buffer 612 is connected to the internal circuit 40, and an output terminal of the output buffer 612 is connected to the node ND1.

When a large positive voltage is applied to the pad 321 as the ESD, the second diode 512 breaks down, and a current flows from the pad 321 to the node ND3. This allows the ESD of the positive voltage to be mitigated via the second diode 512 and can protect the internal circuit 40. On the other hand, when a large negative voltage is applied to the pad 321 as the ESD, the first diode 511 breaks down, and a current flows from the node ND2 to the pad 321. This allows the ESD of the negative voltage to be mitigated via the first diode 511 and can protect the internal circuit 40.

The electrostatic withstand voltage of the ESD protection element 51 changes depending on an area of a PN junction of the first diode 511 and the second diode 512. As the area of the PN junction is larger, the electrostatic withstand voltage becomes higher, and as the area of the PN junction is smaller, the electrostatic withstand voltage becomes lower. Further, transfer speed (I/O operation speed) of a signal from the pad 321 to the internal circuit 40 changes depending on the area of the PN junction of the first diode 511 and the second diode 512 that configure the ESD protection element 51 and parasitic capacitance generated by the PN junction. As the area of the PN junction is larger, the transfer speed of the signal becomes lower, and as the area of the PN junction is smaller, the transfer speed of the signal becomes higher. In other words, the electrostatic withstand voltage and the transfer speed of the signal are in a trade-off relationship. The path P21 directly connects the pad 321 and the internal circuit 40 without interposition of the ESD protection element 51, and thus, the transfer speed (first transfer speed) of the signal through the path P21 is higher than the transfer speed (second transfer speed) of the signal through the path P22. On the other hand, an electrostatic withstand voltage (first withstand voltage) of the path P21 is lower than an electrostatic withstand voltage (second withstand voltage) of the path P22. Thus, as the path that connects the pad 321 and the internal circuit 40, one of the path P21 and the path P22 is selected in consideration of transfer speed required for the signal to be inputted/outputted from the pad 321 and an electrostatic withstand voltage required at the internal circuit 40. In a process of forming a wiring, for example, a wiring is physically formed only in the selected one path using a mask option. A specific method for forming the wiring will be described in detail later.

The ESD protection element 52 has, for example, the same circuit configuration as the circuit configuration of the ESD protection element 51. An area of the first diode and the second diode that configure the ESD protection element 52 is equal to an area of the first diode 511 and the second diode 512 that configure the ESD protection element 51. In other words, the electrostatic withstand voltage of the ESD protection element 52 is equal to the electrostatic withstand voltage (second withstand voltage) of the ESD protection element 51. On the other hand, while the ESD protection element 53 has, for example, the same circuit configuration as the circuit configuration of the ESD protection element 51, an area of the first diode and the second diode that configure the ESD protection element 53 is larger than the area of the first diode 511 and the second diode 512 that configure the ESD protection element 51. In other words, an electrostatic withstand voltage (third withstand voltage) of the ESD protection element 53 is higher than the electrostatic withstand voltage (second withstand voltage) of the ESD protection element 51. Thus, in a situation where each is electrically connected, the electrostatic withstand voltage is the highest in the path P43 and becomes lower in order of the path P42 and the path P41. Further, transfer speed of a signal (third speed) through the path P43 is lower than the transfer speed (second speed) of the signal through the path P42. In other words, the transfer speed of the signal from the pad 341 to the internal circuit 40 is the highest through the path P41 and becomes lower in order of the path P42 and the path P43. Thus, as the path that connects the pad 341 and the internal circuit 40, one of the path P41, the path P42 and the path P43 is selected in consideration of transfer speed required for the signal to be inputted/outputted from the pad 341 and an electrostatic withstand voltage required at the internal circuit 40. A wiring is physically formed only in the selected path.

The signal transfer speed required for the signal (data) to be inputted from the pad (for example, the pad 321) formed in the input/output pad group 32 is higher than the signal transfer speed required for the signal (control signal) to be inputted from the pad (for example, the pad 341) formed in the logic control pad group 34. Thus, in the path that connects the pad 341 and the internal circuit 40, the ESD protection element 53 with low transfer speed and a high electrostatic withstand voltage is also disposed in addition to the ESD protection element 52 with transfer speed equal to the transfer speed of the ESD protection element 51. In this manner, an ESD protection element having performance corresponding to I/O operation speed and an electrostatic withstand voltage which may be required is disposed in the ESD protection circuit that connects each pad and the internal circuit 40 in accordance with characteristics of the signal to be inputted/outputted from the pad. Note that a circuit configuration of the ESD protection element provided in the ESD protection circuit is not limited to the circuit configuration illustrated in FIG. 4. If the required electrostatic withstand voltage and the operation speed can be achieved, circuit configurations other than the circuit configuration illustrated in FIG. 4 may be employed. Further, ESD protection elements having different circuit configurations may be mixed.

Note that while FIG. 3 illustrates an example where one ESD protection element 51 and one through path (path P22) are provided in the ESD protection circuit 50 that connects the pad 321 formed in the input/output pad group 32 and the internal circuit 40, an ESD protection element having an electrostatic withstand voltage different from the electrostatic withstand voltage of the ESD protection element 51 may be further provided, and two or more through paths corresponding to the respective ESD protection elements may be laid out. Further, also concerning the ESD protection circuit 50 that connects the pad 341 formed in the logic control pad group 34 and the internal circuit 40, an ESD protection element having an electrostatic withstand voltage different from the electrostatic withstand voltages of the ESD protection elements 52 and 53 may be further provided, and three or more through paths corresponding to the respective ESD protection elements may be laid out. The pad 351 formed in the power input pad group 35 is directly connected to the internal circuit 40 without interposition of the ESD protection circuit. Other pads formed in the power input pad group 35 are also directly connected to the internal circuit 40 without interposition of the ESD protection circuit in a similar manner. The ESD protection unit 5 may be expanded, and an ESD protection circuit may be provided also between the pad 351 formed in the power input pad group 35 and the internal circuit 40.

(1-3. Configuration of Block)

Figure 5:
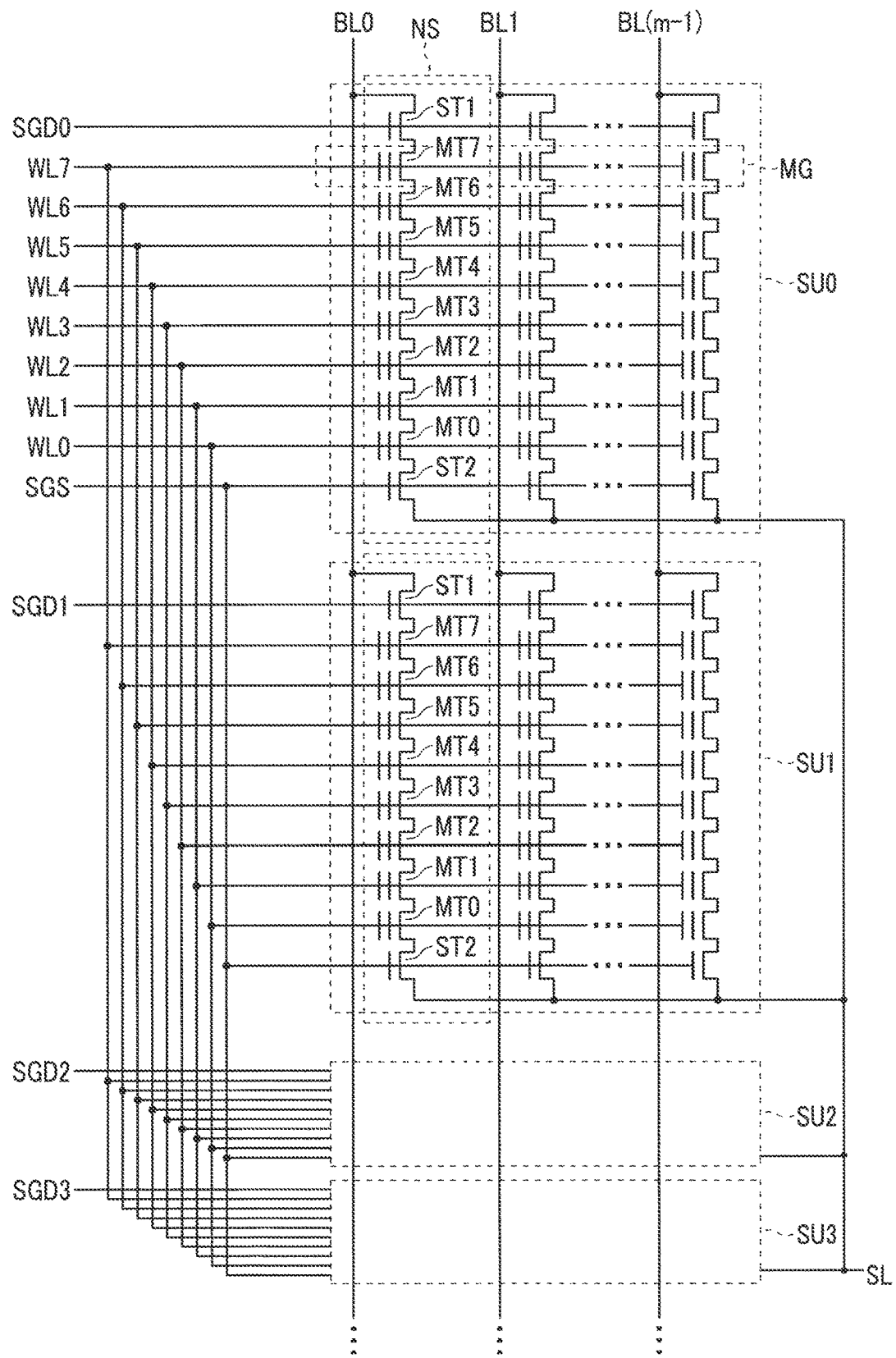
FIG. 5 is a view illustrating a circuit configuration example of a block of a memory cell array of a NAND memory having a three-dimensional structure.

As described above, the memory cell array 23 of the NAND memory having the three-dimensional structure includes a plurality of blocks. FIG. 5 is a view illustrating a circuit configuration example of a block of the NAND memory having the three-dimensional structure. FIG. 5 illustrates the circuit configuration of one block, but other blocks of the memory cell array 23 have similar configurations. As illustrated in FIG. 5, the block includes, for example, four string units SU (SU0 to SU3). Further, each string unit SU includes a plurality of NAND strings NS. Each of the NAND strings NS includes, for example, eight memory cell transistors MT (MT0 to MT7) and select gate transistors ST1 and ST2. The memory cell transistor MT includes a gate and a charge accumulation layer and stores data in a non-volatile manner.

Note that the number of the memory cell transistors MT is not limited to eight, and, for example, 32, 48, 64 or 96 memory cell transistors MT may be provided.

The memory cell transistors MT are disposed so as to be connected in series between the select gate transistors ST1 and ST2. The memory cell transistor MT7 on one end side is connected to one end of the select gate transistor ST1, and the memory cell transistor MT0 on the other end side is connected to one end of the select gate transistor ST2.

Gates of the respective select gate transistors ST1 of the string units SU0 to SU3 are connected in common to the respective select gate lines SGD0 to SGD3. On the other hand, gates of the select gate transistors ST2 of a plurality of string units SU within the same block are connected in common to the same select gate line SGS. Further, control gates of the memory cell transistors MT0 to MT7 in the same block are connected in common to respective word lines WL0 to WL7. In other words, while the word lines WL0 to WL7 and the select gate line SGS are connected in common among the plurality of string units SU0 to SU3 in the same block, the select gate lines SGD (SGD0 to SGD3) are independent for each of the string units SU0 to SU3 even in the same block.

The word lines WL0 to WL7 are respectively connected to control gate electrodes of the memory cell transistors MT0 to MT7 that configure the NAND string NS, and the memory cell transistors MTi (i=0 to n) in each NAND string NS are connected in common by the same word lines WLi (i=0 to n). In other words, the memory cell transistors correspond to the word lines in each NAND string NS.

The other end (an end portion on a side not connected to the memory cell transistor MT7) of the select gate transistor ST1 of the NAND string NS is connected to one of m bit lines. The bit lines BL are connected in common to the NAND strings NS at a position in one of the string units SU0 to SU3 in the same block. Further, the bit lines BL are connected in common to the corresponding NAND strings NS over a plurality of blocks. Further, the other end (an end portion on a side not connected to the memory cell transistor MT0) of the select gate transistor ST2 is connected to a source line SL. The source line SL is connected in common to the plurality of NAND strings NS over a plurality of blocks.

Data in memory cells (memory cell transistors MT) in the same block are collectively erased. On the other hand, read and write of data is performed in units of memory cell group MG (or in page unit). In the present specification, a plurality of memory cells connected to one word line WLi and belonging to one string unit SU will be defined as a memory cell group MG. One word line WLi and one select gate line SGD are selected upon read operation and write operation in accordance with a physical address, and the memory cell group MG is selected.

(1-4. Cross-Section Structure of Semiconductor Device)

Figure 6B:
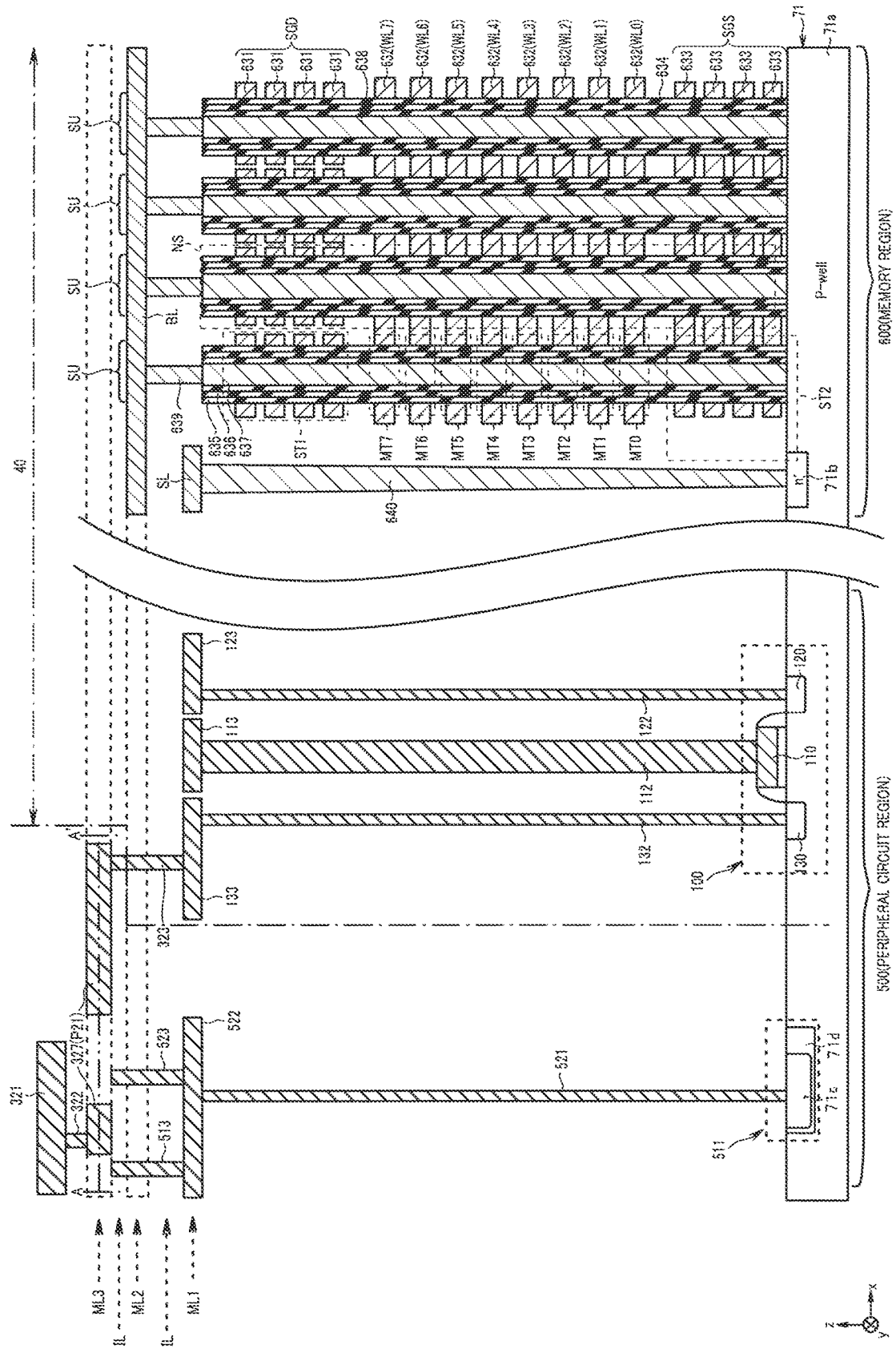
FIG. 6B is a cross-sectional view of a partial region of the semiconductor device including a memory cell array of the NAND memory having the three-dimensional structure.

FIG. 6A and FIG. 6B are cross-sectional views of a partial region of a semiconductor device including a memory cell array of a NAND memory having a three-dimensional structure. FIG. 6A illustrates an example of a case where the pad 321 and the internal circuit 40 are connected using the path P22, and FIG. 6B illustrates an example of a case where the pad 321 and the internal circuit 40 are connected using the path P21. Note that both FIG. 6A and FIG. 6B illustrate a partial region of the memory cell array and a peripheral circuit region. In the following description, a direction on a plane parallel to a surface of the semiconductor substrate 71 and in which the bit lines BL extend will be defined as an x direction. Further, a direction parallel to the surface of the semiconductor substrate 71 and orthogonal to the x direction will be defined as a y direction. Further, a direction orthogonal to the surface of the semiconductor substrate 71 will be defined as a z direction. In the present embodiment, a memory region 600 in which the memory cell array 23 is formed is provided on the semiconductor substrate 71, and a peripheral circuit region 500 in which peripheral circuits are formed is provided on the semiconductor substrate 71 around the memory region 600. In other words, in a case of being viewed from the z direction, the memory region 600 and the peripheral circuit region 500 are disposed so as not to overlap with each other. The peripheral circuits are components such as the input/output circuit 22 and the logic control circuit 21, other than the memory cell array 23 which configure the non-volatile memory 2. A configuration that is common regardless of the path that connects the pad 321 and the internal circuit 40 will be described below using FIG. 6A.

As illustrated in FIG. 6A, in the memory region 600, a p-well region 71a is formed in part of the surface of the semiconductor substrate 71 and a plurality of NAND strings NS are formed on the p-well region 71a. In other words, a plurality of wiring layers 633 that function as the select gate lines SGS, a plurality of wiring layers 632 that function as the word lines WLi and a plurality of wiring layers 631 that function as the select gate line SGD are stacked on the p-well region 71a. Note that while FIG. 6A illustrates a structure in which eight wiring layers 632 that function as the word lines WLi are stacked, in the memory cell array of the semiconductor storage device, more wiring layers 632, for example, 48, 64 or 96 wiring layers 632 may be stacked.

Further, a memory hole 634 that pierces through the wiring layers 631, 632 and 633 and reaches the p-well region 71a is formed. On a side surface of the memory hole 634, a block insulating film 635, a charge accumulation film 636 and a gate insulating film 637 are sequentially formed, and, further, a conductor post 638 is embedded into the memory hole 634. The conductor post 638, which is, for example, formed with polysilicon, functions as a region in which a channel is formed upon operation of the memory cell transistors MTi and the select transistors ST1 and ST2 included in the NAND string NS.

In each NAND string NS, the select transistor ST2, a plurality of memory cell transistors MTi and the select transistor ST1 are formed on the p-well region 71a. A wiring layer that functions as the bit lines BL is formed on an upper side of the conductor post 638. A contact plug 639 that connects the conductor post 638 and the bit lines BL is formed on an upper end of the conductor post 638.

Further, an n+ impurity diffusion layer 71b is formed within a surface of the p-well region 71a. A contact plug 640 is formed on the n+ impurity diffusion layer 71b, and a wiring layer that functions as the source line SL is formed on the contact plug 640.

A plurality of configurations illustrated in FIG. 6A described above are arranged in a depth direction (y direction) on paper of FIG. 6A, and one string unit SU is formed by an aggregate of a plurality of NAND strings NS arranged in line in the depth direction.

On the other hand, respective circuits included in the peripheral circuits such as the input/output circuit 22 are formed in the peripheral circuit region 500. For example, the input/output circuit 22 described above has a configuration in which logical gates such as an inverter are combined in multiple stages. Thus, in the peripheral circuit region 500, a large number of MOS (metal oxide semiconductor) transistors 100 that configure the logical gates are formed. The large number of MOS transistors are formed on the semiconductor substrate 71 in the peripheral circuit region 500. FIG. 6A illustrates one of the MOS transistors. Note that FIG. 6A schematically illustrates a cross-section structure of the non-volatile memory, and a size of the MOS transistor 100 illustrated in FIG. 6A and a ratio among elements that configure the MOS transistor 100 are different from an actual size and ratio.

In the MOS transistors 100 that configure the peripheral circuit, a gate wiring 110 is formed on the semiconductor substrate 71 via a gate insulating film. The gate wiring 110 is, for example, a polysilicon film into which impurities appropriate for operation of the MOS transistors are doped. A drain region 120 and a source region 130 are formed in the semiconductor substrate 71 on a right side and a left side in the X direction of the gate wiring 110. For example, in a case where the MOS transistor 100 is an n-type MOS transistor (NMOS transistor), impurities such as arsenic (As) and phosphorus (P) are doped into the semiconductor substrate 71 in the drain region 120 and the source region 130 and diffused to a predetermined depth.

A metal wiring 113 for supplying a voltage to the gate wiring 110 is formed in an upper layer of the gate wiring 110. On an upper side of the gate wiring 110, a contact plug 112 for electrically connecting the metal wiring 113 and the gate wiring 110 is formed. In other words, a voltage of the metal wiring 113 is supplied to the gate wiring 110 via the contact plug 112.

A metal wiring 123 for supplying a voltage to the drain region 120 is formed in an upper layer of the drain region 120. A contact plug 122 for electrically connecting the metal wiring 123 and the drain region 120 is formed on an upper side of the drain region 120. In other words, a voltage of the metal wiring 123 is supplied to the drain region 120 via the contact plug 122.

A metal wiring 133 for supplying a voltage to the source region 130 is formed in an upper layer of the source region 130. A contact plug 132 for electrically connecting the metal wiring 133 and the source region 130 is formed on an upper side of the source region 130. In other words, a voltage of the metal wiring 133 is supplied to the source region 130 via the contact plug 132. A contact plug 323 is formed on an upper side of the metal wiring 133.

The ESD protection circuits 50 and 50a are also formed in the peripheral circuit region 500. For example, the ESD protection circuit 50 has a configuration including the ESD protection element 51 and a wiring formed in one of the path P21 and the path P22. FIG. 6A illustrates an example of a case where the pad 321 and the internal circuit 40 are connected using the path P22, and thus, a wiring is not formed in the path P21. Thus, FIG. 6A illustrates the first diode 511 that is one of the components of the ESD protection element 51 and wirings 325 and 326 that are wirings formed as the path P22. Note that while the ESD protection element 51 is configured with a plurality of diodes as described above, description of structures of individual components that configure the ESD protection element 51 will be omitted here.

An anode region 71c that is a p-type impurity diffusion layer into which p-type impurities are doped, and a cathode region 71d that is an n-type impurity diffusion layer into which n-type impurities are doped are formed in the semiconductor substrate 71 in the region where the first diode 511 is formed. A metal wiring 522 is formed in an upper layer of the first diode 511. The metal wiring 522 is connected to the anode region 71c of the first diode 511 via the contact plug 521. The cathode region 71d is connected to a wiring (not illustrated) that transmits the power supply voltage Vcc with a contact plug (not illustrated). Further, a contact plug 513 and a contact plug 523 are formed on an upper side of the metal wiring 522.

The wiring layers (metal wiring layers) formed with a metal material, such as the bit line BL, the source line SL and the metal wirings 113, 123, 133 and 522 are formed in an upper layer of the NAND string NS after the NAND string NS is formed. Normally, a plurality of the wiring layers formed with a metal material are formed while insulating films IL are put between the wiring layers. FIG. 6A illustrates an example of a case where three wiring layers of ML1, ML2 and ML3 are provided. The bit line BL, the source line SL and the metal wirings 113, 123, 133 and 522 are formed in one or more layers among the wiring layers. For example, FIG. 6A illustrates a case where the metal wirings 113, 123, 133 and 522 and the source line SL are formed in the wiring layer ML1 that is the first layer from the bottom, and the bit line BL is formed in the wiring layer ML2 that is the second layer from the bottom.

In the wiring layer ML3 in the uppermost layer, for example, a wiring that transmits a power supply voltage, a wiring that connects the pad 321 and the internal circuit 40 via the ESD protection circuit 50, and the like, are formed. In other words, a wiring formed in the wiring layer ML3 has a configuration different in accordance with a path that connects the pad 321 and the internal circuit 40. In FIG. 6A, the wirings 325 and 326 are formed as wirings that connect the pad 321 and the internal circuit 40 via the ESD protection circuit 50. On the other hand, in FIG. 6B, the wiring 327 is formed as the wiring that connects the pad 321 and the internal circuit 40 via the ESD protection circuit 50. A plurality of pads including the pad 321 are formed above the uppermost wiring layer ML3. The contact plug 322 is formed on a lower side of the pad 321. Note that a plurality of pads may be directly formed on the semiconductor substrate 71 via an insulating film. In this case, the plurality of pads are electrically connected to the wiring layer ML3 via a contact plug, or the like. The plurality of formed pads are separated into the input/output pad group 32, the logic control pad group 34 and the power input pad group 35 as described in FIG. 3 for each application.

The wirings that electrically connect the pads formed in the input/output pad group 32, the logic control pad group 34 and the power input pad group 35, and the internal circuit 40 are laid out in a wiring layer (upper layer region) located above among the wiring layers ML1 to ML3. In the present embodiment, description will be provided assuming that the upper layer region is the wiring layer ML3. For example, two paths (the path P21 and the path P22) for connecting the pad 321 formed in the input/output pad group 32 and the internal circuit 40, and three paths (the path P41, the path P42 and the path P43) for connecting the pad 341 formed in the logic control pad group 34 and the internal circuit 40 are laid out in the wiring layer ML3. When the wiring layer ML3 is formed, one of the path P21 and the path P22, and one of the path P41, the path P42 and the path P43 are selected, and wirings are formed only in the selected path.

Figure 7A:
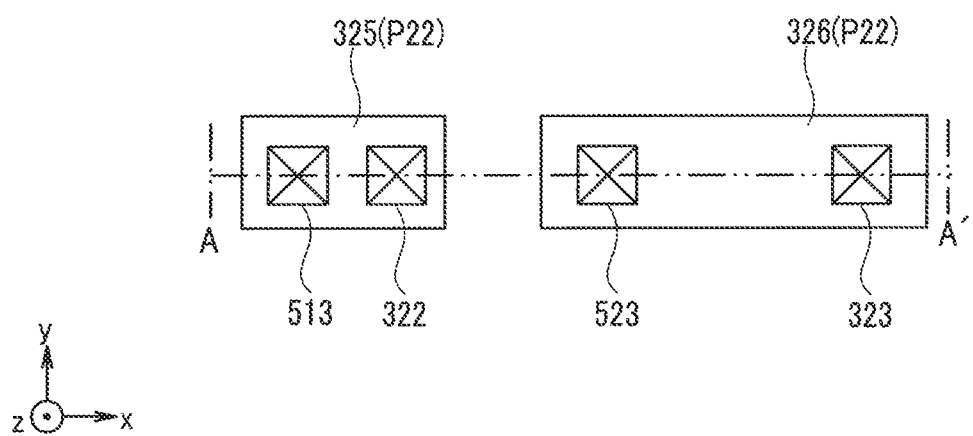
FIG. 7A is a plan view for explaining an example of layout of a wiring that connects pads and an internal circuit.
Figure 7B:
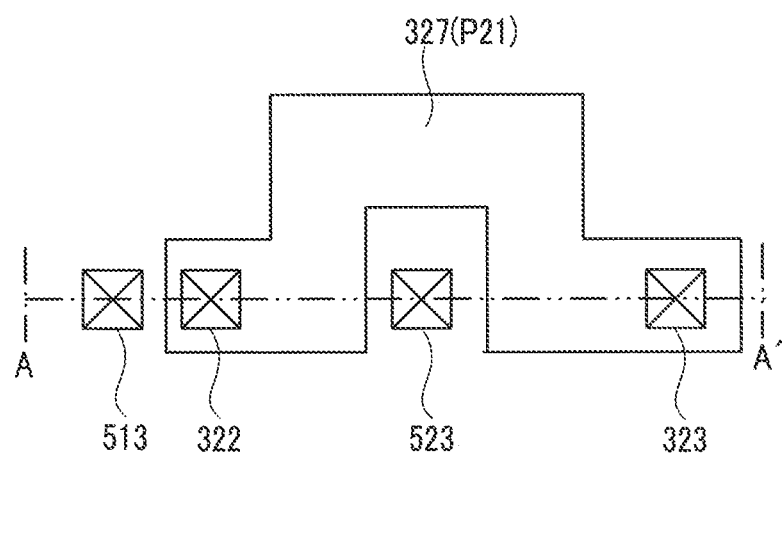
FIG. 7B is a plan view for explaining an example of layout of the wiring that connects the pads and the internal circuit.

FIG. 7A and FIG. 7B are plan views for explaining an example of layout of the wirings that connect the pad and the internal circuit. FIG. 7A illustrates an example of a case where the pad 321 and the internal circuit 40 are connected using the path P22, and FIG. 7B illustrates an example of a case where the pad 321 and the internal circuit 40 are connected using the path P21. Note that both FIG. 7A and FIG. 7B are plan views of a partial region in the wiring layer ML3 and illustrate a region corresponding to a line A-A' illustrated in FIG. 6A and FIG. 6B.

In a case where the pad 321 and the internal circuit 40 are connected using the path P22 as illustrated in FIG. 7A, the wiring 325 formed in the wiring layer ML3 is laid out so as to connect the contact plug 322 and the contact plug 513. Further, the wiring 326 is laid out so as to connect the contact plug 523 and the contact plug 323. By laying out and forming the wirings 325 and 326 in this manner, the pad 321 is connected to the internal circuit 40 via the ESD protection element 51. In other words, the wirings 325 and 326 correspond to the path P22. On the other hand, in a case where the pad 321 and the internal circuit 40 are connected using the path P21 as illustrated in FIG. 7B, the wiring 327 formed in the wiring layer ML3 is laid out so as to connect the contact plug 322 and the contact plug 323. In this event, the contact plugs 513 and 523 are connected to none of the wirings. By laying out and forming the wiring 327 in this manner, the pad 321 is directly connected to the internal circuit 40 without interposition of the ESD protection element 51. In other words, the wiring 327 corresponds to the path P21.

Note that while a case has been described above where three wiring layers of ML1 to ML3 are provided, four or more wiring layers may be provided. Further, the above-described two paths (the path P21 and the path P22) and three paths (the path P41, the path P42 and the path P43) do not necessarily have to be located in the same layer and only require to be selectable using several wiring layers in the upper layer region.

2. Manufacturing Method

Figure 8:
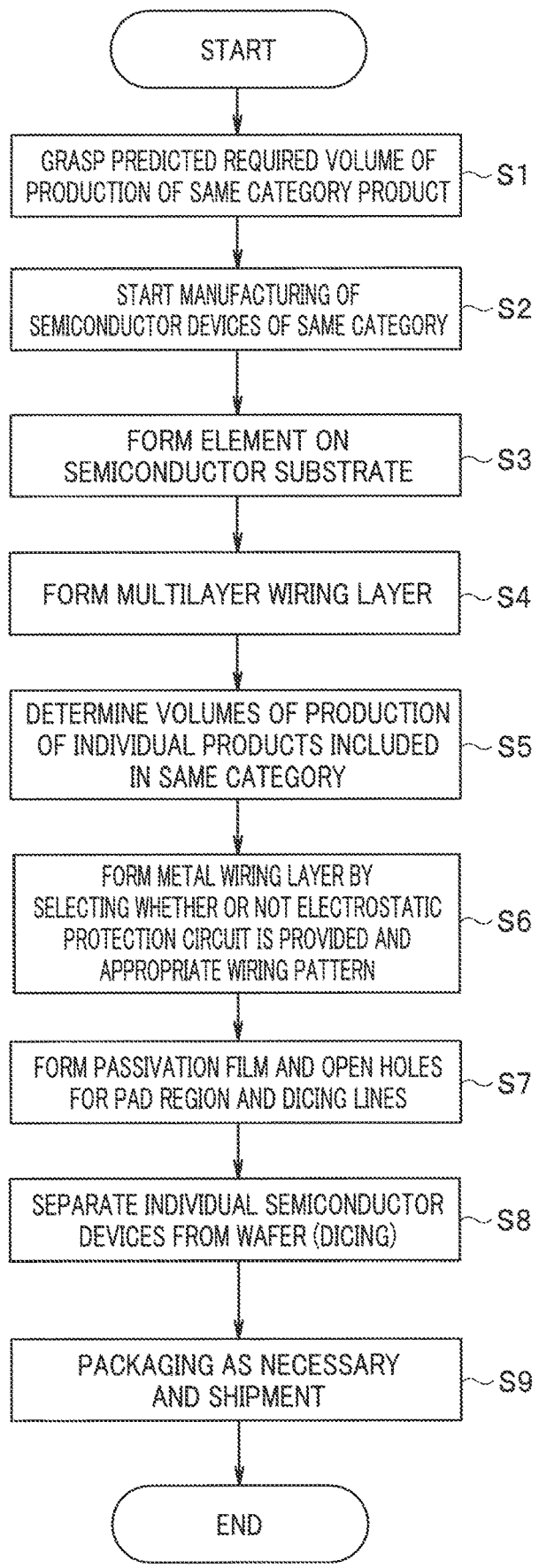
FIG. 8 is a flowchart for explaining an example of a method for manufacturing and production management of the semiconductor device according to the embodiment.

An example of a production management method including a manufacturing method of the semiconductor device according to the present embodiment will be described next. FIG. 8 is a flowchart for explaining an example of the manufacturing and a production management method of the semiconductor device according to the embodiment. In the following description, a production management method in a series of manufacturing processes from a manufacturing plan to shipment will be described using an example of a case where a semiconductor device including a memory cell array of a NAND memory having a three-dimensional structure illustrated in FIG. 6A and FIG. 6B is manufactured.

First, a predicted required volume of production of the same category product is grasped (S1). Here, the same category product means a product group with the same circuits, wirings, and the like, although the same category product includes products including or not including an ESD protection circuit in a wiring that connects pads and the internal circuit 40 and includes different types (ESD protection element) of the ESD protection circuit. In the manufacturing process of the semiconductor device, a large number of unit processes are required in the process described in S3 below, and it takes a long period for the processes. While there is a case where it is difficult to accurately predict a product volume of each of a plurality of products prior to the long period, there can be a case where a product volume of the same category product can be relatively accurately predicted.

Then, manufacturing of the semiconductor device in the same category is started in view of a yield ratio of each process on the basis of the predicted volume grasped in S1 (S2). Subsequently, by repeating processes such as formation of an insulating film such as a silicon oxide film using a CVD (chemical vapor deposition) method, or the like, etching of part of the insulating film to open a hole using an etching technique such as a photolithography technique and RIE (reactive ion etching), formation of an impurity region at an opened hole portion using an ion implantation method, and formation of a conductive film such as polycrystal silicon as necessary, an element such as a transistor and a resistor is formed on the semiconductor substrate 71 such as silicon (S3). In this process, the peripheral circuit and the ESD protection element are also formed. The process requires a large number of unit processes, and it is necessary to repeat the unit processes, so that it takes a long period for the process.

Subsequently, a multilayer wiring layer is formed on the above-described semiconductor substrate 71 on which the element, and the like, are formed by repeating formation of an insulating film, a conductive film and a conductive plug (S4).

Then, production volumes of individual products included in the above-described same category product are determined (S5). In other words, the production volumes are determined for each of product standards (I/O operation speed and an electrostatic withstand voltage) of the individual products. Compared to the remaining processes at a time point of S1, it takes an extremely shorter period for the remaining processes in and after S5, and the production volumes of the individual products included in the same category product can be estimated with extremely higher accuracy at the time point of S5 than at the time point of S1.

Subsequently, whether or not the ESD protection circuit is provided and a type of the ESD protection element are selected in accordance with the product standards (I/O operation speed and the electrostatic withstand voltage) of the individual products, and an appropriate wiring layer pattern (wiring path) is selected so as to be able to bypass the ESD protection element to form a wiring layer (metal wiring layer) in the upper layer region (S6). As is well-known, in the manufacturing process of the semiconductor device, components such as a large number of elements, contact plugs and wirings are formed on the semiconductor substrate through a large number of processing processes. Each processing process requires, for example, a mask pattern to be printed on a glass mask for photoresist processing. Such a mask pattern can be stored as a set of mask patterns for a plurality of layers for each of processing layers such as X1, X2, X3, . . . , Xn, Xn+1, Xn+2, . . . in accordance with processing order. Here, in the manufacturing method of the present embodiment, in a layer (for example, Xn+2) to be used in a wiring process close to a final process, it is possible to prepare a plurality of option masks such as Xn+2-A, Xn+2-B and Xn+2-C and switch an option mask in accordance with the product standards of the individual products.

For example, as a mask pattern for the wiring layer ML3 illustrated in FIG. 6A and FIG. 6B, a mask pattern in which a wiring pattern illustrated in FIG. 7A is laid out and a mask pattern in which a wiring pattern illustrated in FIG. 7B is laid out are prepared in advance and stored. By selecting and using one of the mask patterns in accordance with the product standards of the individual products, it is possible to form one of a wiring that bypasses the ESD protection element or a wiring that goes through the ESD protection element in the wiring layer ML3. In this manner, in the process in S6, a wiring layer (metal wiring layer) in the upper layer region can be formed by selecting an appropriate wiring layer pattern (wiring path) in the process in S6. In and after S6, the semiconductor devices are managed for each of products with the same path of the wiring formed in the ESD protection circuit and with the same I/O operation speed and with the same electrostatic withstand voltage instead of being collectively managed as the same category product.

Then, a final insulating film (passivation film) is formed, and holes for an electrode pad region for external connection and regions (dicing lines) for separation into a plurality of semiconductor devices on the same semiconductor substrate are opened through etching (S7).

Subsequently, the regions for separation (dicing lines) are cut through blade dicing, or the like, for separation into individual chips (S8).

Finally, necessary tests such as an energization test are performed, necessary packages are assembled for each of the product standards, or the individual chips are shipped as is (S9).

In this manner, according to the present embodiment, an ESD protection element with the I/O operation speed and the electrostatic withstand voltage which may be required is formed for each pad formed in the input/output pad group 32 and the logic control pad group 34. Further, the semiconductor device is designed such that as a path that connects each pad and the internal circuit 40, a path that bypasses the ESD protection element and a path that goes through each ESD protection element can be formed in the metal wiring layer in advance. According to such a configuration, it is possible to form a wiring while selecting a path in accordance with the I/O operation speed and the electrostatic withstand voltage to be required for the chip upon patterning of the metal wiring layer. It is therefore possible to provide a semiconductor device capable of easily achieving a structure in view of the I/O operation speed and the electrostatic withstand voltage, and a manufacturing method of the semiconductor device. Further, according to the present embodiment, even in a case where the I/O operation speed and the electrostatic withstand voltage are undetermined at a time point of start of a manufacturing process of a chip, layers lower than the metal wiring layer can be formed. This eliminates the need to wait for start of manufacturing until the I/O operation speed and the electrostatic withstand voltage are determined, so that it is possible to complete manufacturing earlier than in a case where manufacturing is started after the I/O operation speed and the electrostatic withstand voltage are determined.

Note that the semiconductor device of the present embodiment can be applied regardless of an arrangement structure of the memory cell array 23 and the peripheral circuit. For example, a structure in which the memory cell array 23 and the peripheral circuit are arranged side by side on the semiconductor substrate 71 or a structure in which the peripheral circuit is formed on the semiconductor substrate 71 and the memory cell array 23 is formed above the peripheral circuit may be employed. Further, a structure in which the memory cell array 23 and the peripheral circuit are formed in different chips and are subsequently bonded together may be employed.

Figure 9B:
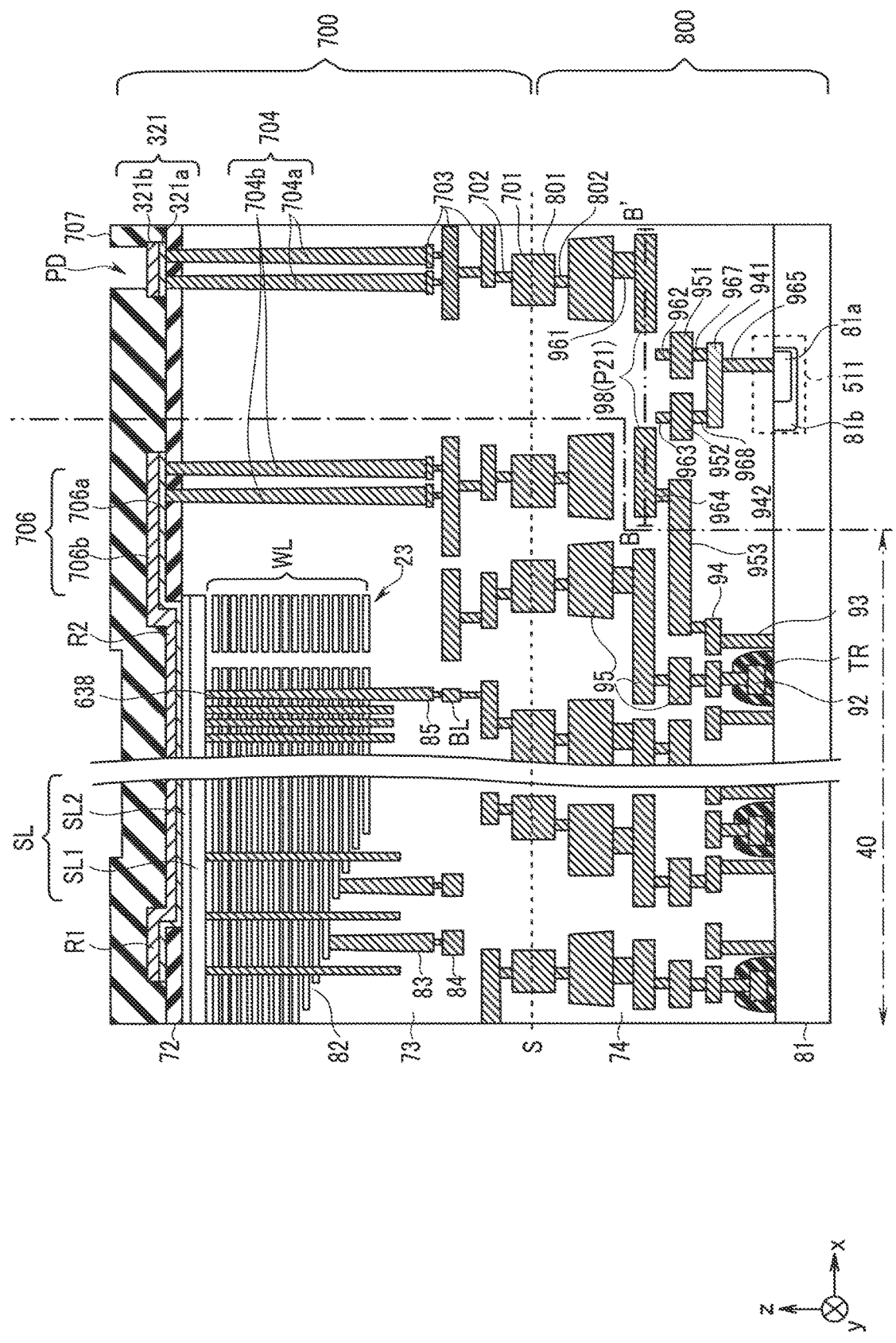
FIG. 9B is a schematic cross-sectional view for explaining a structure of the semiconductor device formed by bonding the array chip and the circuit chip.

FIG. 9A and FIG. 9B are schematic cross-sectional views for explaining a structure of a semiconductor device formed by bonding an array chip and a circuit chip. FIG. 9A illustrates an example of a case where the pad 321 and the internal circuit 40 are connected using the path P22, and FIG. 9B illustrates an example of a case where the pad 321 and the internal circuit 40 are connected using the path P21. As illustrated in FIG. 9A and FIG. 9B, the semiconductor device has a structure (bonded structure) in which an array chip 700 and a circuit chip 800 are bonded together. In the following description, regardless of the path that connects the pad 321 and the internal circuit 40, a common configuration will be described using FIG. 9A.

The array chip 700 includes the memory cell array 23 including a plurality of memory cells, the insulating film 72 on the memory cell array 23, and an interlayer insulating film 73 under the memory cell array 23. The circuit chip 800 is provided under the array chip 700. A reference numeral S indicates a bonding surface of the array chip 700 and the circuit chip 800. The circuit chip 800 includes an interlayer insulating film 74 and a substrate 81 under the interlayer insulating film 74. The substrate 81 is, for example, a semiconductor substrate such as a silicon substrate.

The array chip 700 includes a plurality of word lines WL and source lines SL as a plurality of electrode layers in the memory cell array 23. FIG. 9A illustrates a stepped structure portion 82 of the memory cell array 23. Each word line WL is electrically connected to a word line wiring layer 84 via a contact plug 83. The conductor post 638 that pierces through the plurality of word lines WL is electrically connected to the bit lines BL via a via plug 85 and is also electrically connected to the source lines SL. The source lines SL are provided on the word lines WL and are electrically connected to a source wiring layer 706. The source lines SL include a first layer SL1 that is a semiconductor layer and a second layer SL2 that is a metal layer. The second layer SL2 is provided on the first layer SL1 and functions as a barrier metal layer.

The circuit chip 800 includes a plurality of transistors TR. Each transistor TR includes a gate electrode 92 provided on the substrate 81 via a gate insulating film, and a source diffusion layer and a drain diffusion layer (not illustrated) provided in the substrate 81. Further, the circuit chip 800 includes a plurality of contact plugs 93 provided on the source diffusion layer or the drain diffusion layer of the transistors TR, a wiring layer 94 including a plurality of wirings provided on the contact plugs 93, and a plurality of wiring layers 95 provided on the wiring layer 94 and each including a plurality of wirings.

The circuit chip 800 further includes a plurality of via plugs 802 provided on the wiring layers 95, and a plurality of metal pads (bonded electrodes) 801 provided on the via plugs 802. The circuit chip 800 functions as a control circuit (logic circuit) that controls operation of the array chip 700. The control circuit, which is configured with transistors TR, and the like, is electrically connected to the metal pads 801. The control circuit includes, for example, a peripheral circuit of the memory cell array 23.

The ESD protection circuits 50 and 50a are also formed on the substrate 81 of the circuit chip 800. For example, the ESD protection circuit 50 has a configuration including the ESD protection element 51, and a wiring formed in one of the path P21 and the path P22. FIG. 9A illustrates an example of a case where the pad 321 and the internal circuit 40 are connected using the path P22, and thus, a wiring is not formed in the path P21. Thus, FIG. 9A illustrates a first diode 511 that is one of components of the ESD protection element 51, and wirings 96 and 97 that are wirings formed as the path P22. The wirings 96 and 97 are formed on one of the above-described wiring layers 95.

In the semiconductor substrate 81 in the region where the first diode 511 is formed, an anode region 81a that is a p-type impurity diffusion layer into which p-type impurities are doped, and a cathode region 81b that is an n-type impurity diffusion layer into which n-type impurities are doped are formed. A wiring 941 is formed in the wiring layer 94 in an upper layer of the first diode 511. The wiring 941 is connected to the anode region 81a of the first diode 511 via a contact plug 965. The cathode region 81b is connected to a wiring (not illustrated) that transmits the power supply voltage Vcc via a contact plug (not illustrated). Further, in the wiring layer 95, wirings 951 and 952 are formed in a lower layer of a layer in which the wirings 96 and 97 are formed. The wiring 951 and the wiring 941 are connected via a contact plug 967. The wiring 952 and the wiring 941 are connected via a contact plug 968. A contact plug 962 is formed on an upper side of the wiring 951, and a contact plug 963 is formed on an upper side of the wiring 952. A contact plug 964 is formed on an upper side of the wiring 953 which is connected to the source diffusion layer or the drain diffusion layer of the transistors TR included in the internal circuit 40 and which connects the internal circuit 40 and the ESD protection circuit 50.

The array chip 700 includes a plurality of metal pads (bonded electrodes) 701 provided on the metal pad 801, a plurality of via plugs 702 provided on the metal pads 701, and a plurality of wiring layers 703 provided on the via plugs 702 and each including a plurality of wirings. Further, the array chip 700 includes a plurality of via plugs 704 provided on the wiring layer 703, and the via plugs 704 include a plurality of via plugs 704a and a plurality of via plugs 704b. The via plugs 704 are provided on a side of the memory cell array 23.

The array chip 700 further includes the pad 321 and a source wiring layer 706, and a passivation film 707. The pad 321 is provided on the via plugs 704a and the insulating film 72 and is electrically connected to the via plugs 704a by contacting the via plugs 704a. The source wiring layer 706 is provided on the via plugs 704b, the memory cell array 23 and the insulating film 72 and is electrically connected to the via plugs 704b by contacting the via plugs 704b. The source wiring layer 706 includes a first portion R1 provided on the memory cell array 23 via the insulating film 72 and a second portion R2 provided on the memory cell array 23 in the insulating film 72. The source wiring layer 706 is provided on the source lines SL so as to contact the source lines SL at the second portion R2 and is electrically connected to the source lines SL.

The pad 321 and the source wiring layer 706 are provided in the same wiring layer. The pad 321 includes a barrier metal layer 321a and a wiring material layer 321b. The source wiring layer 706 includes a barrier metal layer 706a and a wiring material layer 706b. The passivation film 707 is provided on the pad 321, the source wiring layer 706 and the insulating film 72. The passivation film 707, which is, for example, an insulating film such as a silicon oxide film, has an aperture portion PD through which an upper surface of the pad 321 is exposed. The pad 321 is connectable to a mounted substrate and other devices through a bonding wire, a solder ball, a metal bump, or the like, via the aperture portion PD.

In the wiring layer 95 of the circuit chip 800, a layer in which the wiring that connects the pad 321 and the internal circuit 40 via the ESD protection circuit 50 is formed has wiring layout different in accordance with a path that connects the pad 321 and the internal circuit 40. In FIG. 9A, the wirings 96 and 97 are formed as the wirings that connect the pad 321 and the internal circuit 40 via the ESD protection circuit 50. On the other hand, in FIG. 9B, the wiring 98 is formed as the wiring that connects the pad 321 and the internal circuit 40 via the ESD protection circuit 50.

Figure 10A:
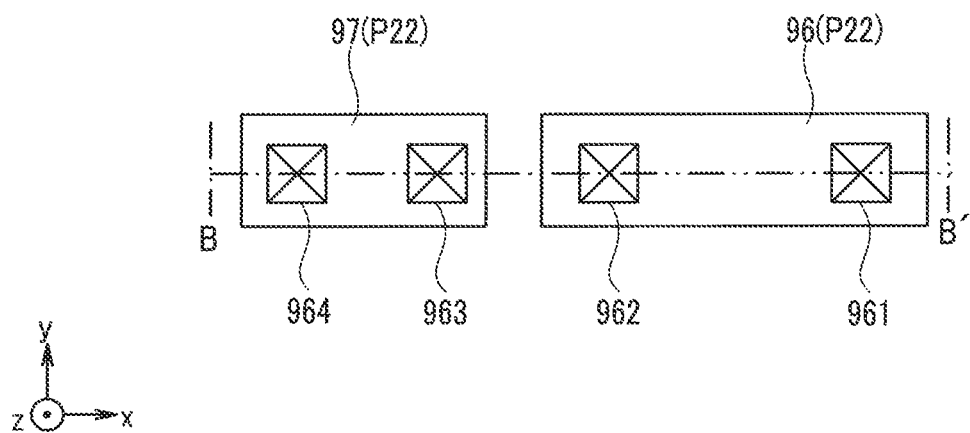
FIG. 10A is a plan view for explaining an example of layout of the wiring that connects the pads and the internal circuit.
Figure 10B:
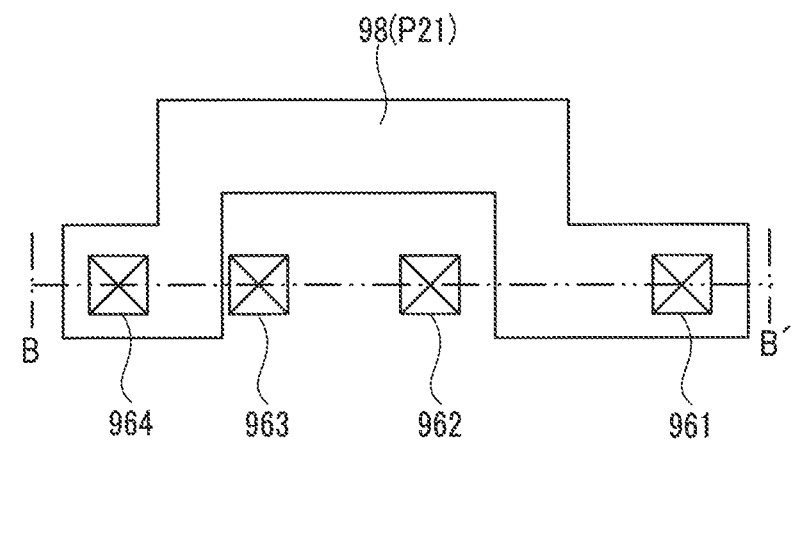
FIG. 10B is a plan view for explaining an example of layout of the wiring that connects the pads and the internal circuit.

FIG. 10A and FIG. 10B are plan views for explaining an example of layout of the wiring that connects the pad and the internal circuit. FIG. 10A illustrates an example of a case where the pad 321 and the internal circuit 40 are connected using the path P22, and FIG. 10B illustrates an example of a case where the pad 321 and the internal circuit 40 are connected using the path P21. Note that both FIG. 10A and FIG. 10B are plan views of a partial region in the wiring layer 95 and illustrate a region corresponding to a line B-B' illustrated in FIG. 9A and FIG. 9B.

As illustrated in FIG. 10A, in a case where the pad 321 and the internal circuit 40 are connected using the path P22, the wiring 96 formed in the wiring layer 95 is laid out so as to connect the contact plug 961 and the contact plug 962. Further, the wiring 97 is laid out so as to connect the contact plug 963 and the contact plug 964. By laying out and forming the wirings 96 and 97 in this manner, the pad 321 and the internal circuit 40 are connected via the ESD protection element 51. In other words, the wirings 96 and 97 correspond to the path P22. On the other hand, as illustrated in FIG. 10B, in a case where the pad 321 and the internal circuit 40 are connected using the path P21, the wiring 98 formed in the wiring layer 95 is laid out so as to connect the contact plug 961 and the contact plug 964. In this event, the contact plugs 962 and 963 are connected to none of the wirings. By laying out and forming the wiring 98 in this manner, the pad 321 and the internal circuit 40 are directly connected without interposition of the ESD protection element 51. In other words, the wiring 98 corresponds to the path P21.

In a case of such a semiconductor device having a bonded structure, the ESD protection circuit is formed on the substrate 81 of the circuit chip 800, and a wiring that electrically connects the pads formed in the input/output pad group 32, the logic control pad group 34 and the power input pad group 35, and the internal circuit 40 is laid out in the wiring layer 95 of the circuit chip 800. Thus, the array chip 700 can be independently manufactured regardless of selection of a path that electrically connects the pads formed in the input/output pad group 32, the logic control pad group 34 and the power input pad group 35, and the internal circuit 40. When the wiring layer 95 of the circuit chip 800 is formed (patterned), it is only necessary to form the wiring layer 95 while selecting a wiring corresponding to a path determined in accordance with the product standards of the individual products from a path that selects and goes through the ESD protection elements and a path that bypasses the ESD protection elements.

Figure 11A:
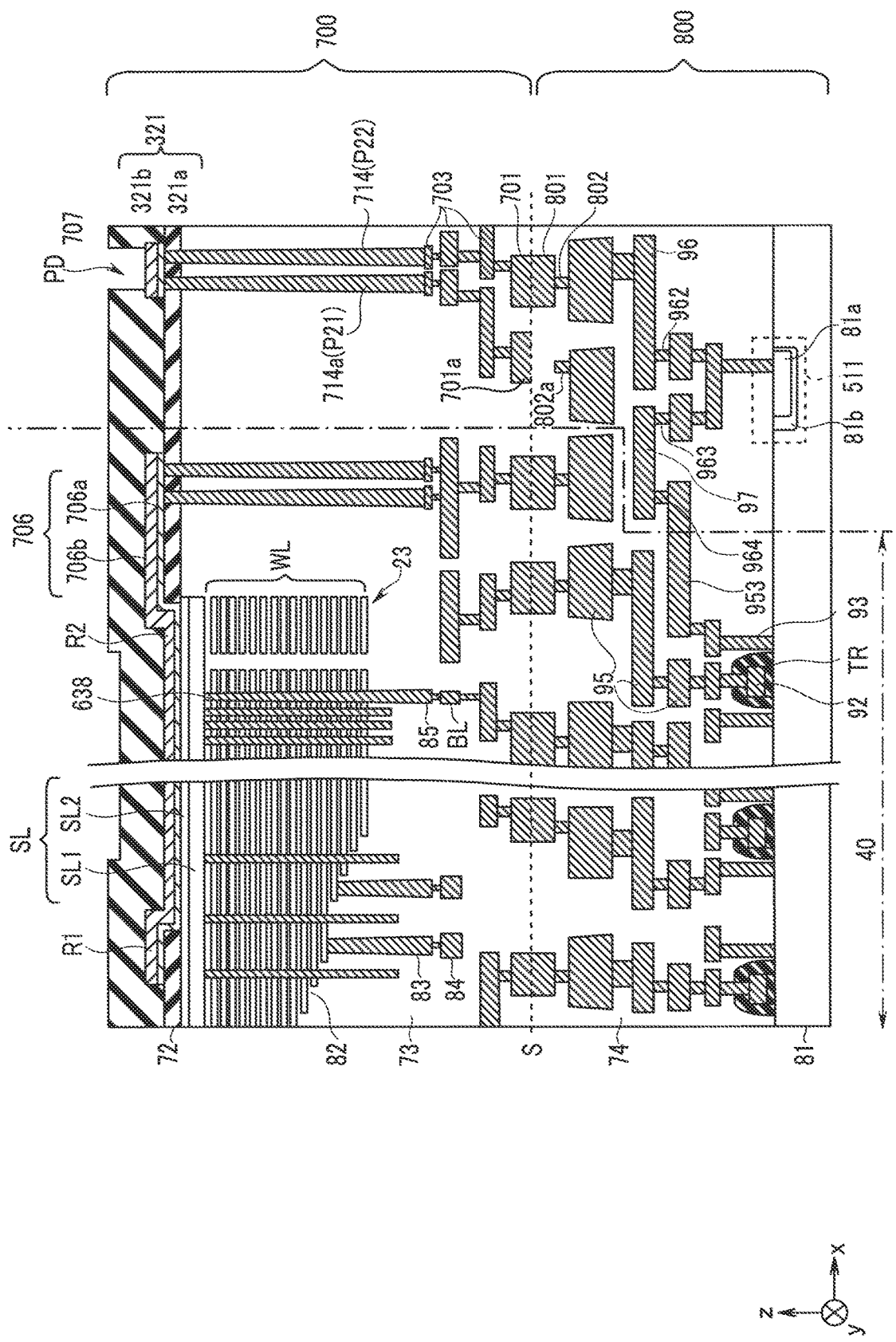
FIG. 11A is a schematic cross-sectional view for explaining another structure of the semiconductor device formed by bonding the array chip and the circuit chip.
Figure 11B:
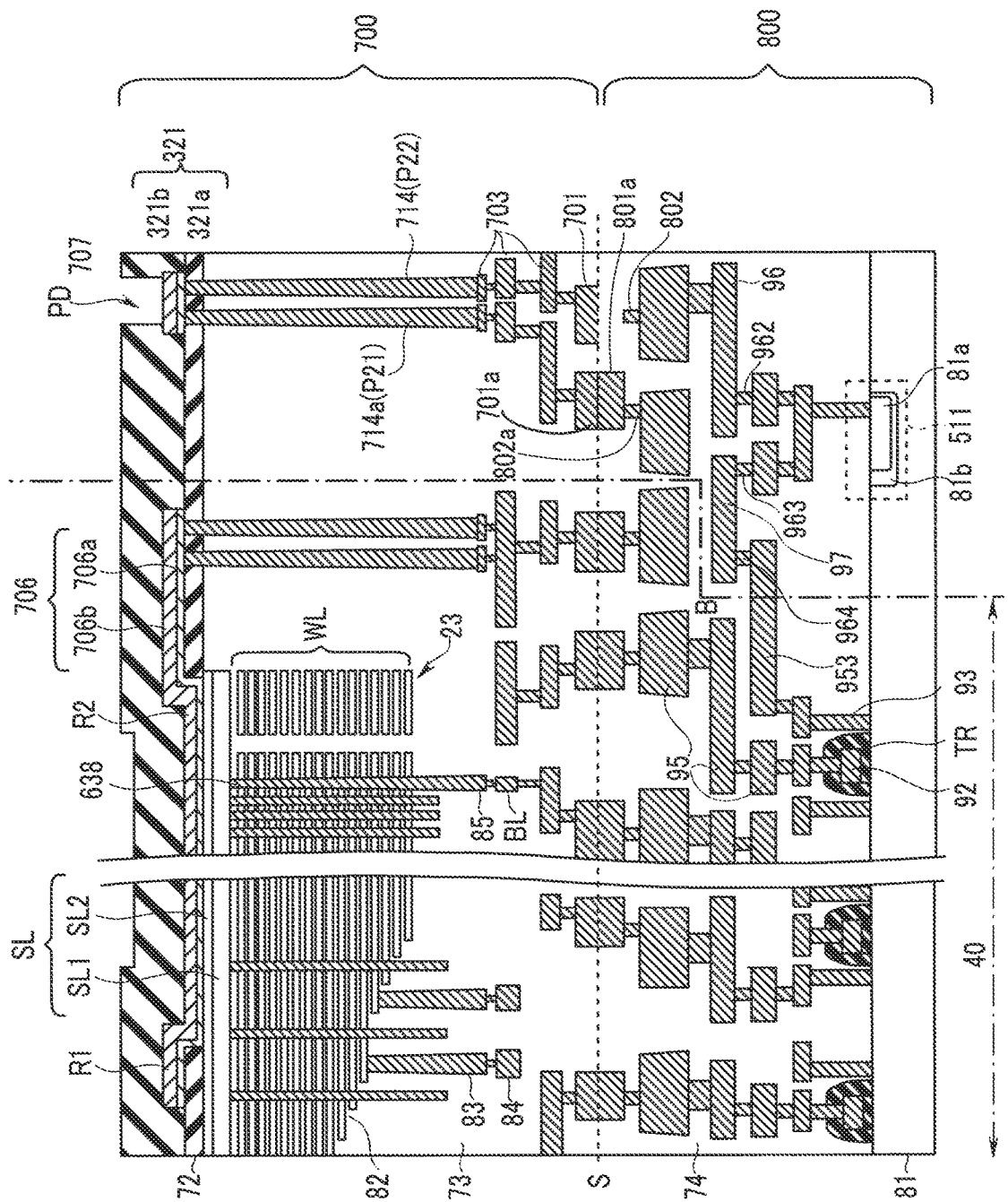
FIG. 11B is a schematic cross-sectional view for explaining another structure of the semiconductor device formed by bonding the array chip and the circuit chip.

Further, as described above, in a case where the semiconductor device of the embodiment has a structure in which the memory cell array 23 and the peripheral circuit, which are formed in different chips, are bonded together, not a wiring pattern of the wiring layer 95 but a position of the metal pad 801 may be changed in accordance with a path that electrically connects the pads formed in the input/output pad group 32, the logic control pad group 34 and the power input pad group 35, and the internal circuit 40. FIG. 11A and FIG. 11B are schematic cross-sectional views for explaining another structure of the semiconductor device formed by bonding an array chip and a circuit chip. FIG. 11A illustrates an example of a case where the pad 321 and the internal circuit 40 are connected using the path P22, and FIG. 11B illustrates an example of a case where the pad 321 and the internal circuit 40 are connected using the path P21.

As illustrated in FIG. 11A and FIG. 11B, in the array chip 700, two via plugs 714 and 714a connected to one pad 321 are connected to different metal pads (bonded electrodes) 701 and 701a via different wirings. On the other hand, in the circuit chip 800, a wiring is formed in the wiring layer 95 in the same arrangement regardless of a path that connects the pad 321 and the internal circuit 40. A wiring (not illustrated) is formed in the same layer as a layer in which the wirings 96 and 97 are formed and at a position with a different y direction in the wiring layer 95. The contact plug 802 is connected to the wiring 96, and the contact plug 802a is connected to the wiring (not illustrated). The wiring (not illustrated) to which the contact plug 802a is connected is connected to the wiring 953 via a contact plug (not illustrated).

As illustrated in FIG. 11A, in a case where the pad 321 and the internal circuit 40 are connected using the path P22, a metal pad 801 is formed on an upper surface of the contact plug 802. The metal pad 801 is electrically connected to the metal pad 701 of the array chip 700. In other words, the internal circuit 40 is connected to the pad 321 via the wiring 97, the ESD protection element 51, the wiring 96, the contact plug 802, the metal pad 801, the metal pad 701 and the via plug 714. A metal pad on a side of the circuit chip 800 that faces the metal pad 701a is not formed, and the metal pad 701a contacts the interlayer insulating film 74 exposed on a surface of the circuit chip 800. On the other hand, as illustrated in FIG. 11B, in a case where the pad and the internal circuit 40 are connected using the path P21, the metal pad 801a is formed on an upper surface of the contact plug 802a. The metal pad 801a is electrically connected to the metal pad 701a of the array chip 700. In other words, the internal circuit 40 is connected to the pad 321 via a wiring (not illustrated), the contact plug 802a, the metal pad 801a, the metal pad 701a and the via plug 714a. A metal pad on a side of the circuit chip 800 that faces the metal pad 701 is not formed, and the metal pad 701 contacts the interlayer insulating film 74 exposed on a surface of the circuit chip 800.

In this manner, wirings for a through path corresponding to the ESD protection element included in the ESD protection circuit (in a case where a plurality of ESD protection elements are included, paths corresponding to the respective protection elements), and a detour path that bypasses the ESD protection element, are formed along with the array chip 700 and the circuit chip 800. Then, when the metal pad 801 of the circuit chip 800 is formed, it is only necessary to form the metal pad 801 at a position connected to the wiring formed in the path selected among the paths.

Note that while a case has been described above where the ESD protection circuits 50 and 50*a* are formed in a path of the pads and the internal circuit 40 formed in the non-volatile memory 2, the present invention can be also applied to corresponding pads provided in the memory controller 1.

While certain embodiments have been described, these embodiments have been presented by way of example only, and are not intended to limit the scope of the inventions. Indeed, the novel devices and systems described herein may be embodied in a variety of other forms; furthermore, various omissions, substitutions and changes in the form of the devices and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate;
   a memory cell array provided on the semiconductor substrate and including a plurality of memory cells;
   a peripheral circuit provided on the semiconductor substrate and configured to control the memory cells, and
   an ESD protection circuit configured to protect the memory cell array or the peripheral circuit from an electrostatic discharge,
   wherein the ESD protection circuit includes at least one ESD protection element,
   the peripheral circuit is connected to a plurality of pads for receiving various kinds of signals from outside or transmitting various kinds of signals to outside,
   at least one of the plurality of pads contacts a first via and a second via,
   the first via contacts one end of a first pad electrode,
   the second via contacts one end of a second pad electrode, and
   another end of the first pad electrode is connected to the peripheral circuit via the ESD protection element, and another end of the second pad electrode contacts an insulating film.

2. The semiconductor device according to claim 1,
   wherein the plurality of pads include a first pad and a second pad, the ESD protection circuit includes a first ESD protection circuit connectable to the first pad and a second ESD protection circuit connectable to the second pad, and the first pad is connected to the peripheral circuit via the first via, the first pad electrode and the first ESD protection circuit.

3. The semiconductor device according to claim 2,
   wherein the first ESD protection circuit includes a plurality of the ESD protection elements with different withstand voltages, and only one of the plurality of the ESD protection elements is connected to the peripheral circuit.

4. The semiconductor device according to claim 2,
   wherein the second pad is a pad for inputting/outputting data, and the first pad is a pad for inputting/outputting a control signal.

5. The semiconductor device according to claim 4,
   wherein the plurality of pads further include a third pad, and the third pad is a pad for power supply configured to supply a power supply voltage and is directly connected to the peripheral circuit without interposition of the ESD protection circuit.

6. The semiconductor device according to claim 4,
   wherein the pad for inputting/outputting the control signal includes a plurality of pads for transmitting/receiving different control signals, the ESD protection circuit is provided for each of the plurality of pads, and a number of the ESD protection elements provided in the ESD protection circuit differs in accordance with characteristics of the control signals.

7. The semiconductor device according to claim 4,
   wherein the pad for inputting/outputting the control signal includes a plurality of pads for transmitting/receiving different control signals, the ESD protection circuit is provided for each of the plurality of pads, and withstand voltages of the ESD protection elements provided in the ESD protection circuit differ in accordance with characteristics of the control signals.

8. The semiconductor device according to claim 3,
   wherein the second ESD protection circuit includes one of the ESD protection elements, and a withstand voltage of the ESD protection element provided in the second ESD protection circuit is equal to a withstand voltage of one of a plurality of the ESD protection elements provided in the first ESD protection circuit.

* * * * *